(12) United States Patent
Zhu et al.

(10) Patent No.: US 11,797,727 B2
(45) Date of Patent: Oct. 24, 2023

(54) DISTRIBUTED-MEMORY PARALLEL PROCESSING OF FINITE ELEMENTS BASED ON CONTACT PAIR SPLITTING

(71) Applicant: ANSYS, INC., Canonsburg, PA (US)

(72) Inventors: Yongyi Zhu, Venetia, CA (US);
Yong-Cheng Liu, Pittsburgh, CA (US);
Jeff Beisheim, McMurray, PA (US);
Grama Bhashyam, Bethel Park, PA (US)

(73) Assignee: ANSYS, INC., Canonsburg, PA (US)

( * ) Notice: Subject to any disclaimer, the term of this patent is extended or adjusted under 35 U.S.C. 154(b) by 1100 days.

(21) Appl. No.: 16/545,940

(22) Filed: Aug. 20, 2019

(65) Prior Publication Data

US 2020/0218790 A1    Jul. 9, 2020

Related U.S. Application Data

(60) Provisional application No. 62/789,846, filed on Jan. 8, 2019.

(51) Int. Cl.
*G06F 30/17* (2020.01)
*G06F 30/20* (2020.01)

(52) U.S. Cl.
CPC .............. *G06F 30/17* (2020.01); *G06F 30/20* (2020.01)

(58) Field of Classification Search
CPC ........... G06F 30/17; G06F 30/20; G06F 30/23
See application file for complete search history.

(56) References Cited

U.S. PATENT DOCUMENTS 10,776,532 B2 * 9/2020 Tonge ................ G06F 30/20

OTHER PUBLICATIONS

Xing et al. "A node-to-node scheme for three-dimensional contact problems using the scaled boundary finite element method." Computer Methods in Applied Mechanics and Engineering 347 (2019): 928-956. (Year: 2019).*
Wang, F. J., Y. T. Feng, and D. R. J. Owen. "Parallelisation for finite-discrete element analysis in a distributed-memory environment." International Journal of Computational Engineering Science 5.01 (2004): 1-23. (Year: 2004).*
Guilbert, Bérengère, et al. "A mortar-based mesh interface for hybrid finite-element/lumped-parameter gear dynamic models—Applications to thin-rimmed geared systems." Journal of Mechanical Design 138.12 (2016). (Year: 2016).*

(Continued)

*Primary Examiner* — Eunhee Kim
(74) *Attorney, Agent, or Firm* — Womble Bond Dickson (US) LLP

(57) ABSTRACT

Methods for modeling contact pairs in a model of a physical object include generating a contact pair including a contact surface and a target surface, where the contact pair further includes contact elements of the contact surface and the target surface, splitting the contact pair into contact sub-pairs along splitting boundaries, augmenting each contact sub-pair with contact elements from adjacent contact sub-pairs at the splitting boundaries, distributing the augmented contact sub-pairs to a plurality of parallel processors for finite element solutions of the contact sub-pairs, receiving the finite element solutions of the contact sub-pairs from the plurality of parallel processors, and combining the finite element solutions of the contact sub-pairs into finite element solutions of the contact pair.

20 Claims, 19 Drawing Sheets

(56) References Cited

OTHER PUBLICATIONS

Mafi, Ramin. "GPU-based parallel computing for nonlinear finite element deformation analysis". McMaster University Department of Electrical & Computer Engineering. Diss. 2014. 172 Pages. (Year: 2014).*

* cited by examiner

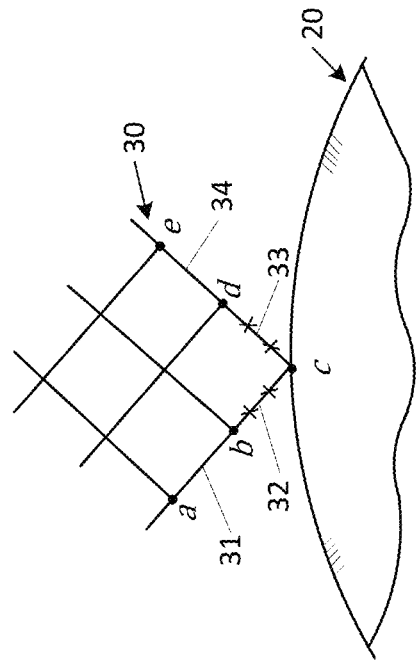
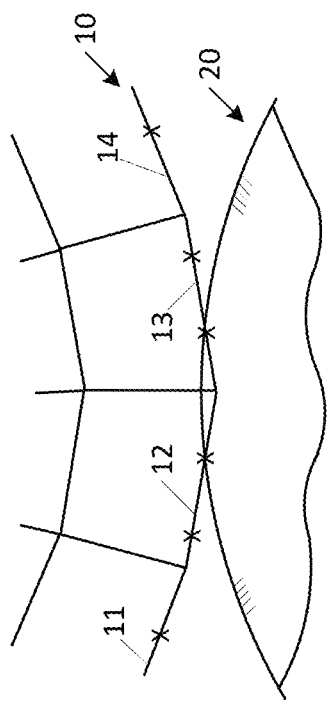
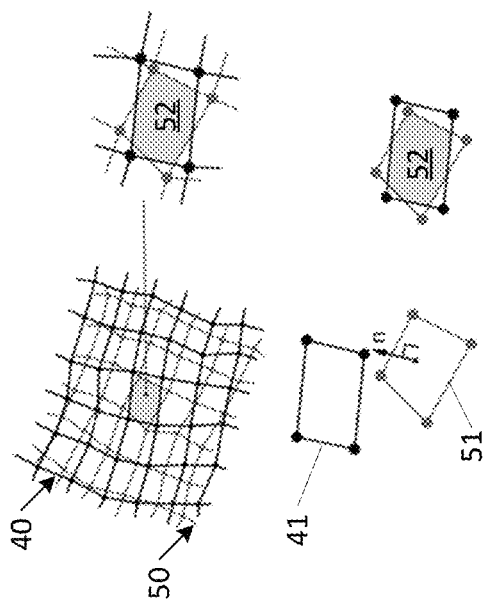
FIG. 1A
GAUSS POINT CONTACT DETECTION
FIG. 1B
NODAL POINT CONTACT DETECTION
FIG. 1C
MORTAR CONTACT DETECTION

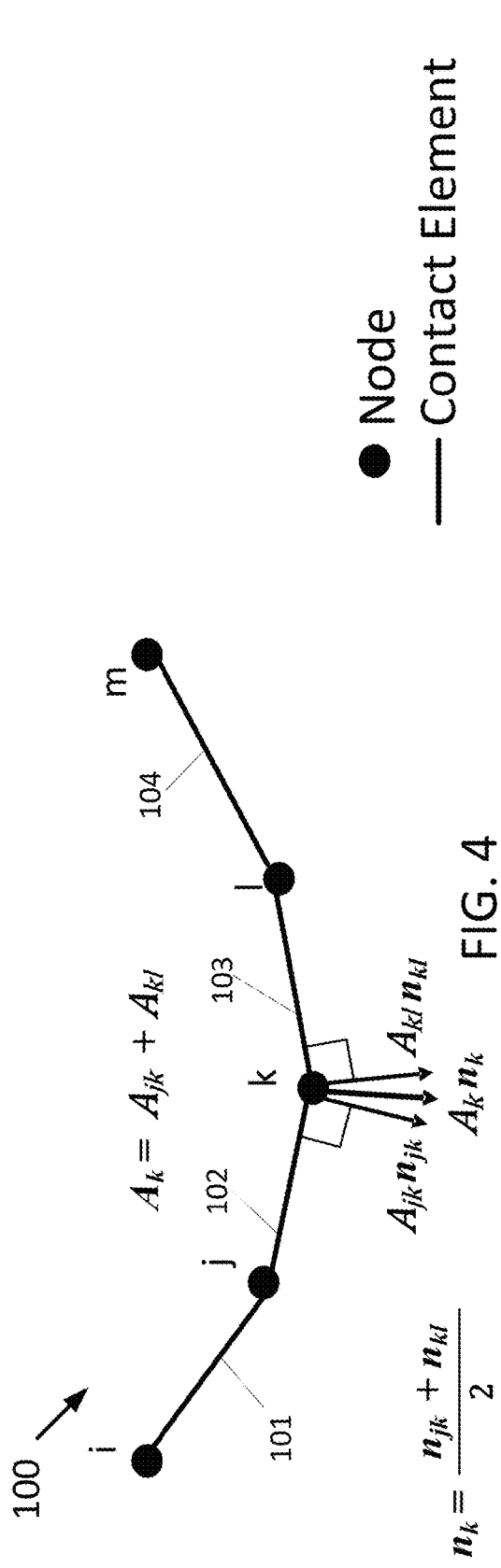
FIG. 4
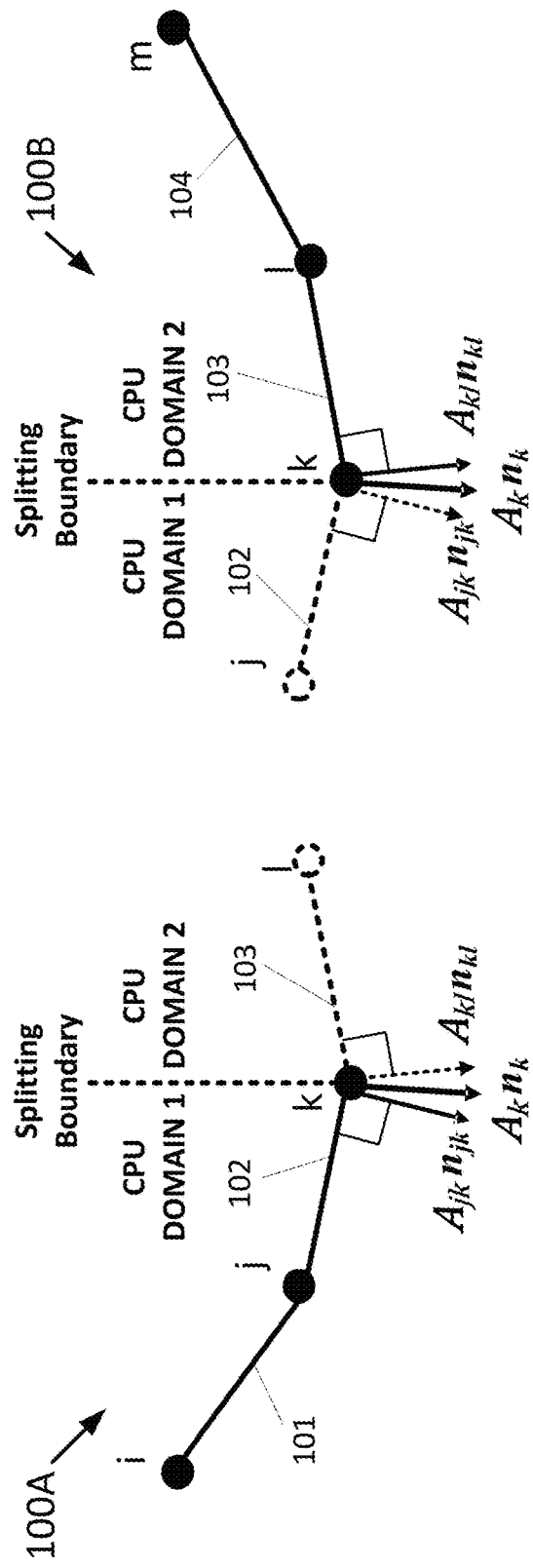
FIG. 5A
FIG. 5B

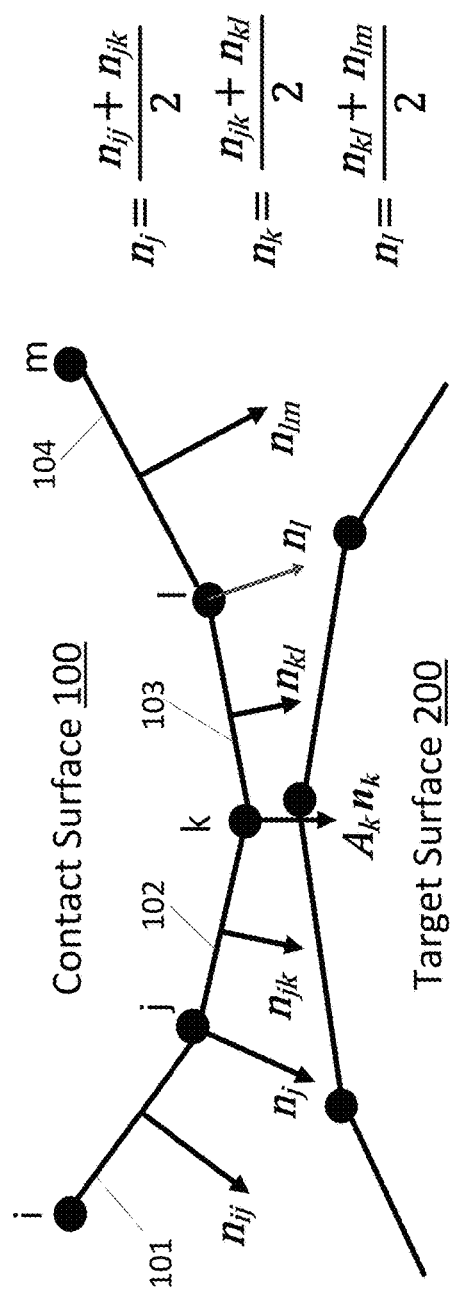
FIG. 6
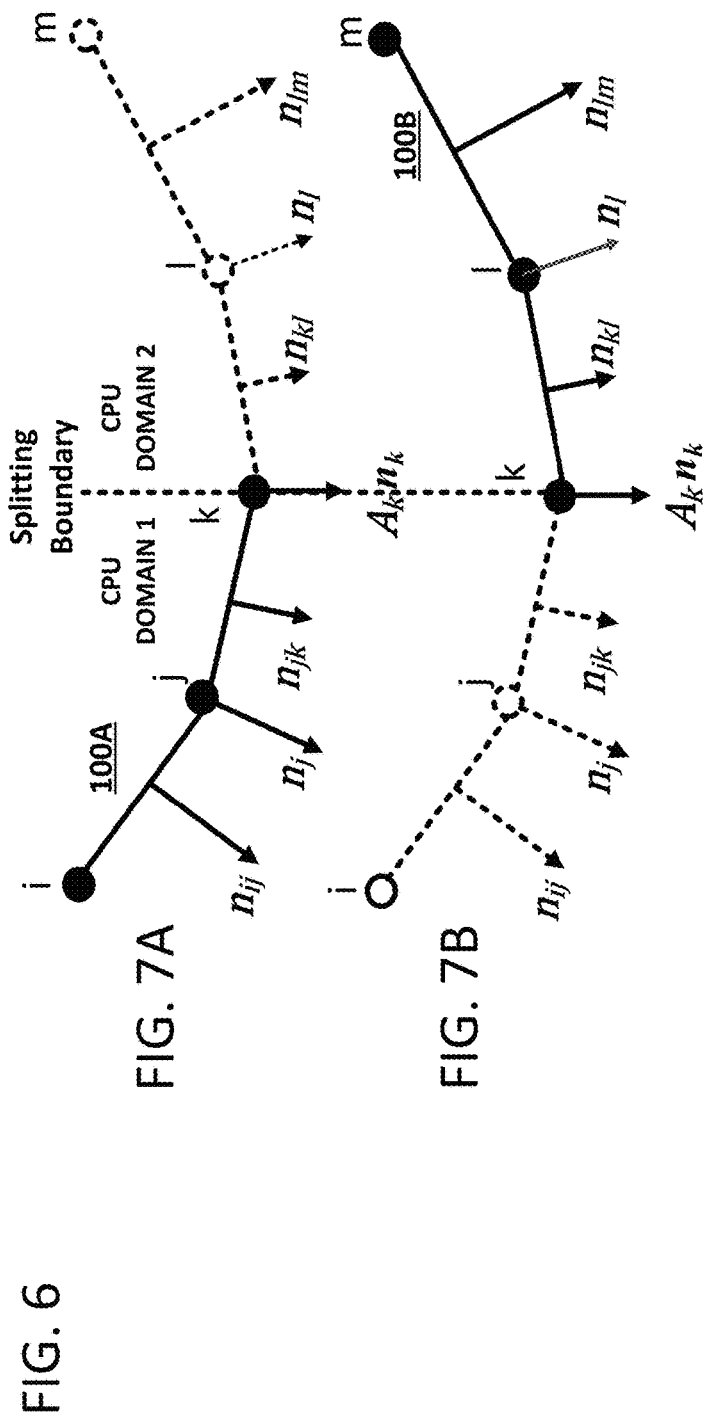
FIG. 7A
FIG. 7B

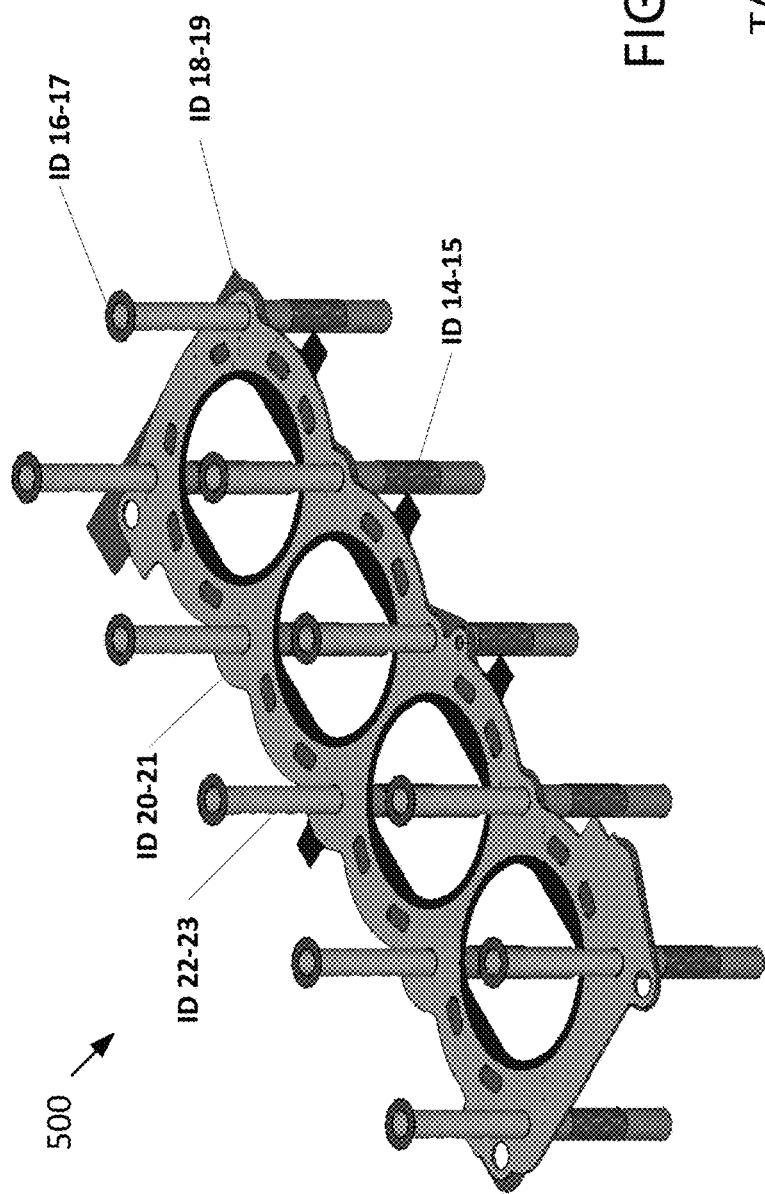

FIG. 11

TABLE 1

| ID | Contact Behavior | Target Type | Contact Type |
|----|------------------|-------------|--------------|
| 14 | Bonded | Flexible | Surface-to-Surface |
| 15 | Bonded | Flexible | Surface-to-Surface |
| 16 | Standard | Flexible | Surface-to-Surface |
| 17 | Standard | Flexible | Surface-to-Surface |
| 18 | Standard | Flexible | Surface-to-Surface |
| 19 | Standard | Flexible | Surface-to-Surface |
| 20 | Bonded | Flexible | Surface-to-Surface |
| 21 | Bonded | Flexible | Surface-to-Surface |
| 22 | Standard | Flexible | Surface-to-Surface |
| 23 | Standard | Flexible | Surface-to-Surface |

SYMMETRIC CONTACT PAIRS

ID 14-15    BOLT SIDE to LOWER BLOCK
ID 16-17    BOLT HEAD to UPPER BLOCK
ID 18-19    GASKET to LOWER BLOCK
ID 20-21    GASKET to UPPER BLOCK
ID 22-23    BOLT SIDE to UPPER BLOCK

FIG. 13

TABLE 2

| ID | Contact Behavior | Target Type | Contact Type |
|---|---|---|---|
| 14 | Bonded | Flexible | Surface-to-Surface |
| 16 | Standard | Flexible | Surface-to-Surface |
| 18 | Standard | Flexible | Surface-to-Surface |
| 20 | Bonded | Flexible | Surface-to-Surface |
| 22 | Standard | Flexible | Surface-to-Surface |
| 48 | Standard | Flexible | Surface-to-Surface |
| 49 | Standard | Flexible | Surface-to-Surface |
| 50 | Standard | Flexible | Surface-to-Surface |
| 51 | Standard | Flexible | Surface-to-Surface |
| 52 | Standard | Flexible | Surface-to-Surface |
| 53 | Standard | Flexible | Surface-to-Surface |
| 54 | Standard | Flexible | Surface-to-Surface |
| 55 | Bonded | Flexible | Surface-to-Surface |
| 56 | Bonded | Flexible | Surface-to-Surface |
| 57 | Bonded | Flexible | Surface-to-Surface |
| 58 | Bonded | Flexible | Surface-to-Surface |
| 59 | Bonded | Flexible | Surface-to-Surface |
| 60 | Bonded | Flexible | Surface-to-Surface |
| 61 | Bonded | Flexible | Surface-to-Surface |

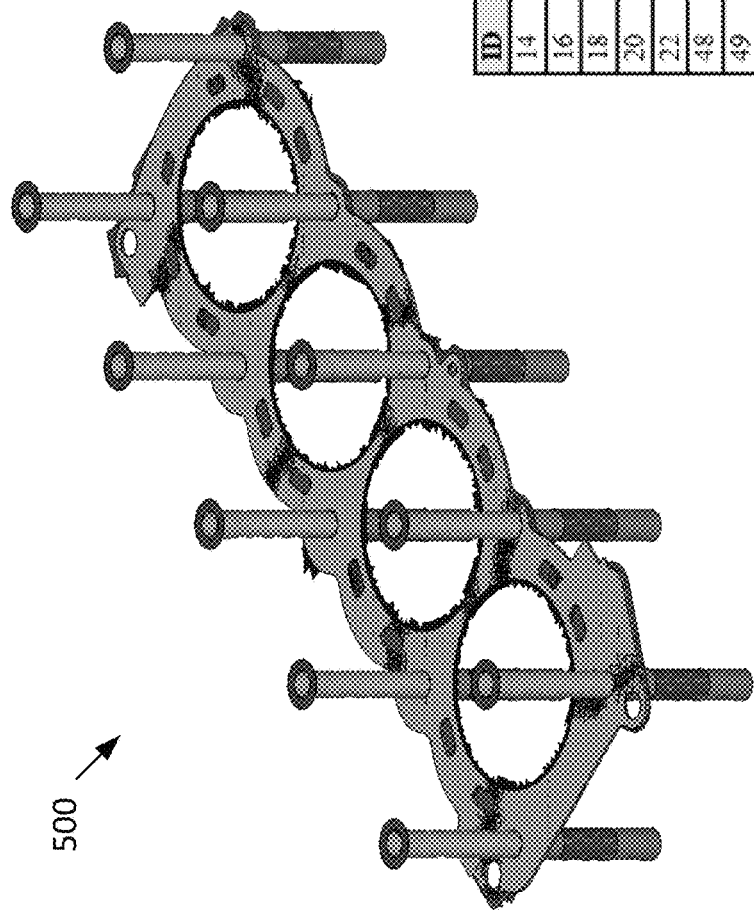

500

19 ASYMMETRIC CONTACT PAIRS
ID 14       BOLT SIDE to LOWER BLOCK
ID 16       BOLT HEAD to UPPER BLOCK
ID 22       BOLT SIDE to UPPER BLOCK
ID 18, 48-54   GASKET to UPPER BLOCK
ID 20, 55-61   GASKET to LOWER BLOCK

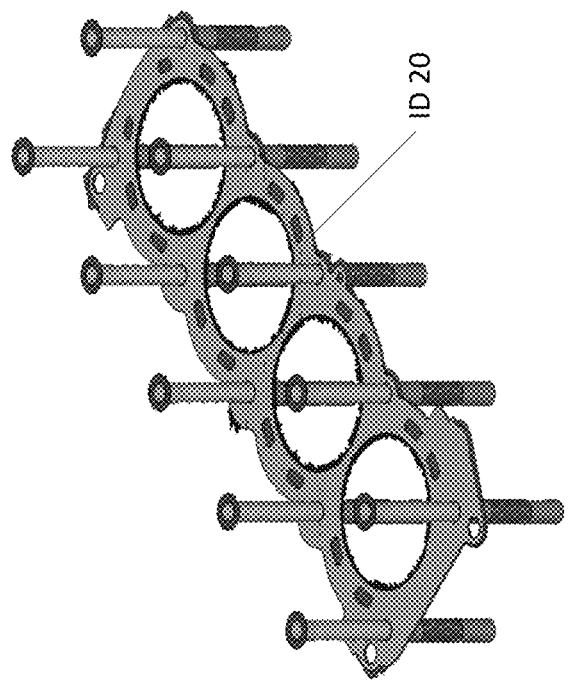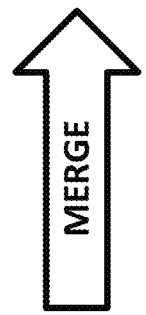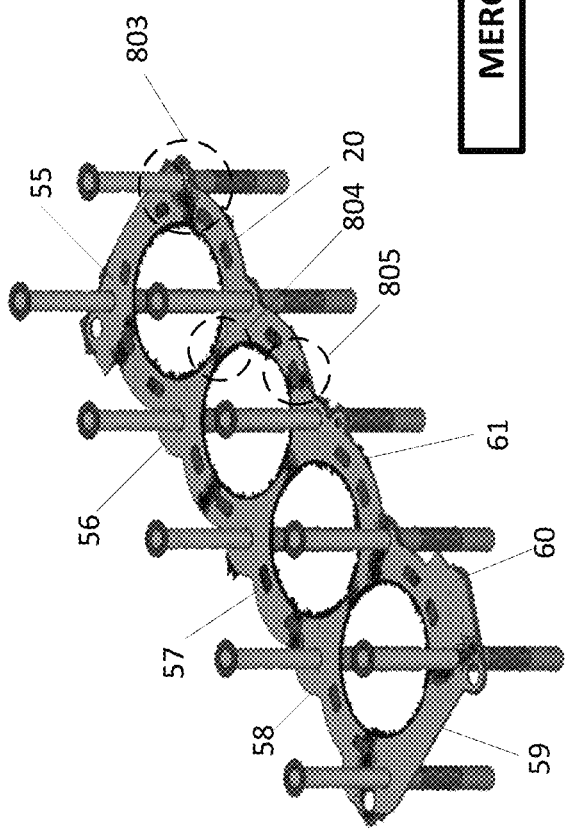
FIG. 18

DISTRIBUTED-MEMORY PARALLEL PROCESSING OF FINITE ELEMENTS BASED ON CONTACT PAIR SPLITTING

CROSS-REFERENCE TO RELATED APPLICATIONS

This application claims priority to U.S. Provisional Patent Application No. 62/789,846, filed on Jan. 8, 2019, which is incorporated herein by reference in its entirety.

FIELD

This disclosure relates generally to the field of computer aided design (CAD), computer-aided engineering (CAE), modeling, and simulation and, in particular to finite element modeling and simulation.

BACKGROUND

Distributed memory parallel processing systems have been used for finite element simulation and analysis, seeking to balance the workload (number of elements, nodes and degrees of freedom) among a number of CPU cores so that each core has approximately the same amount of computational work. However, distributing the computational load evenly becomes a challenge when contact elements are present in the finite element model. Contact elements often require more computations at the element level (e.g., searching for contacts and computing penetration) than other types of finite elements. In traditional approaches, all contact elements in each contact pair are always restricted to a single core to obtain a convergent solution. This restriction can affect the scalability of the simulation by causing one core to have a much higher computational load than other cores, degrading the load balance and increasing solution times. This problem is exacerbated if a large number of contact pairs exist in the model, or when the number of contact elements is a large percentage of the total number of elements in the entire model.

SUMMARY

In studying the behavior of two bodies in contact (e.g., in response to external forces), the surface of one body is defined as a contact surface, and the surface of the other body is defined as a target surface. Together, the contact and target surfaces constitute a "contact pair."

The present disclosure describes systems, methods, and software products for contact pair modeling in an implicit finite element analysis (FEA). The disclosure discusses splitting contact interfaces using domain decomposition, the distribution of a large and complex computational task to a large number of computational domains (e.g., CPU cores), where each computational domain finds a solution to a smaller problem in parallel with other computational domains. The disclosure describes how to split and distribute both contact and target surfaces of a contact pair and how to share contact elements between computational domains to solve the split contact surfaces at the split contact boundaries.

Embodiments of the present disclosure provide a method of improving element load balance for contact simulation in a distributed-memory parallel environment to achieve high parallel processing efficiency.

Embodiments of the present disclosure split large contact pairs into smaller sub-pairs to achieve better scalability in a distributed-memory parallel (DMP) processing environment.

Embodiments of the present disclosure automatically determine the optimal size of the splits for the largest contact pair in the model and further determine how to split other contact pairs proportionally to optimize the element load balance.

Embodiments of the present disclosure are based on the use of shared contact elements between adjacent sub-pairs in different CPU cores to find solutions for contact elements at the splitting boundaries. The shared contact sub-pair elements are used to compute contact normal directions and projected (integrated) element areas at contact nodes along the splitting boundaries of contact sub-pairs, to insure that solutions obtained with splitting are consistent with non-splitting solutions. The shared contact elements are used only to determine the contact normals and projected element areas at the split boundaries and do not contribute to the calculations of internal forces or the stiffness matrix of the FEA model.

In one embodiment, two rows of shared contact elements are used (second order sharing) for mortar contact detection, one row of shared contact elements is used (first order sharing) for nodal contact detection, and no shared contact elements are used (zero order sharing) for Gauss point contact detection.

One embodiment of the present disclosure performs automatic contact splitting operations in the solution phase of the analysis. In addition, the splitting option is performed once for all small sliding or bonded contact pairs along with logic to automatically trim (i.e., delete) contact pairs that never actually make contact during the solution phase of the analysis In one embodiment, a method for modeling contact pairs in a model of a physical object includes generating, in a first processor, a contact pair comprising a contact surface and a target surface, wherein the contact pair further comprises a plurality of contact elements of the contact surface and the target surface; splitting the contact pair into contact sub-pairs along splitting boundaries; augmenting each contact sub-pair with contact elements from adjacent contact sub-pairs at the splitting boundaries; distributing the augmented contact sub-pairs to a plurality of parallel processors for finite element solutions of the contact sub-pairs; receiving the finite element solutions of the contact sub-pairs from the plurality of parallel processors; and combining the finite element solutions of the contact sub-pairs into finite element solutions of the contact pair.

In one embodiment, a method for modeling contact pairs includes receiving from a preprocessor, at a processor in a plurality of processors, an augmented contact sub-pair, the augmented contact sub-pair comprising a contact sub-pair split from a contact pair along splitting boundaries, and augmenting contact elements from adjacent contact sub-pairs along the splitting boundaries; generating a finite element solution for the contact sub-pair using the augmenting contact elements; and sending the finite element solution for the contact sub-pair to a post-processor for a finite element solution of the contact pair.

In one embodiment, a system for modeling contact pairs includes a first processor configured to generate, a contact pair comprising a contact surface and a target surface, wherein the contact pair further comprises a plurality of contact elements of the contact surface and the target surface; split the contact pair into contact sub-pairs along splitting boundaries; augment each contact sub-pair with contact elements from adjacent contact sub-pairs at the splitting boundaries; distribute the augmented contact sub-pairs to a plurality of parallel processors for finite element solutions of the contact sub-pairs; receive the finite element solutions of the contact sub-pairs from the plurality of parallel processors; and combine the finite element solutions of the contact sub-pairs into finite element solutions of the contact pair.

In one embodiment, a non-transitory computer-readable medium includes instructions that, when executed by a processor in a computer modeling system, cause the system to perform operations including generating, in a first processor, a contact pair comprising a contact surface and a target surface, wherein the contact pair further comprises a plurality of contact elements of the contact surface and the target surface; splitting the contact pair into contact sub-pairs along splitting boundaries; augmenting each contact sub-pair with contact elements from adjacent contact sub-pairs at the splitting boundaries; distributing the augmented contact sub-pairs to a plurality of parallel processors for finite element solutions of the contact sub-pairs; receiving the finite element solutions of the contact sub-pairs from the plurality of parallel processors; and combining the finite element solutions of the contact sub-pairs into finite element solutions of the contact pair.

These and other aspects of the present disclosure will be apparent from a reading of the following detailed description together with the accompanying figures, which are briefly described below. The present disclosure includes any combination of two, three, four or more features or elements set forth in this disclosure, regardless of whether such features or elements are expressly combined or otherwise recited in a specific example embodiment described herein. This disclosure is intended to be read holistically such that any separable features or elements of the disclosure, in any of its aspects and examples, should be viewed as combinable unless the context of the disclosure clearly dictates otherwise.

It will therefore be appreciated that this Summary is intended to provide a basic understanding of some aspects of the disclosure without limiting or narrowing the scope or spirit of the disclosure in any way.

BRIEF DESCRIPTION OF THE DRAWINGS

Embodiments of the disclosure are illustrated by way of example and not limitation in the figures of the accompanying drawings in which like references indicate similar elements.

FIG. 1A illustrates an example of Gauss point contact detection in a contact pair;

FIG. 1B illustrates an example of nodal point contact detection in a contact pair;

FIG. 1C illustrates an example of mortar contact detection in a contact pair;

FIG. 4 illustrates an example of nodal point detection in a contact pair;

FIG. 5A and FIG. 5B illustrate examples of nodal point detection in contact sub-pairs at a splitting boundary;

FIG. 6 illustrates an example of mortar contact detection in a contact pair;

FIG. 7A and FIG. 7B illustrate examples of mortar contact detection in contact sub-pairs at a splitting boundary;

FIG. 11 illustrates a model of an example substructure of the finite element model of FIG. 10;

FIG. 13 illustrates contact pair splitting in the model of FIG. 11;

FIG. 18 illustrates the results of the operation of merging contact pairs after the prior splitting operations, according to one embodiment of the present disclosure.

DETAILED DESCRIPTION

Figure 2:
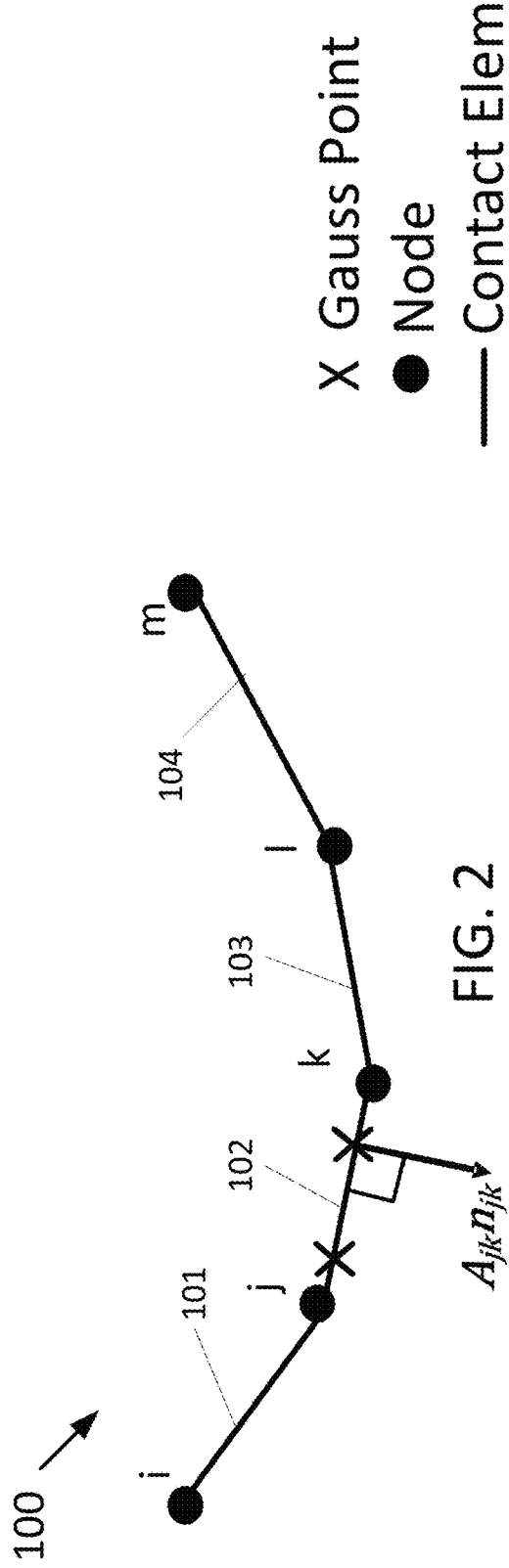
FIG. 2 illustrates an example of Gauss point detection in a contact element.

The present disclosure relates to methods and systems for modeling contact pairs using implicit finite element analysis (FEA) in a distributed-memory parallel (DMP) processing environment.

A contact pair in finite element analysis is a pair of surfaces, comprising sets of surface elements in a finite element model, that are in contact or potentially in contact during simulation. One surface is designated as a contact surface, and the other surface is designated as a target surface. If the two surfaces have different physical properties, the less rigid and more flexible surface is designated as the contact surface (consisting of contact elements), and the more rigid and less flexible surface is designated as the target surface (consisting of target elements). This type of rigid-to-flexible contact is known as asymmetrical contact because all of the contact elements are on one surface and all of the target elements are on the other surface. Contact pairs can also be defined as symmetrical pairs when the material properties of the two surfaces are identical or similar, for self-contact, or when the surfaces have nonhomogeneous physical properties such that both surfaces can have contact elements and target elements. Symmetrical pairs are created as a base pair and a companion pair where the designated contact and target surfaces are reversed from the base pair, and both pairs are active in the analysis. Contact and target elements that make up a contact pair may be associated with each other via a set of shared parameters (real constants) that define the properties of a particular contact pair. Each parameter set is assigned an ID which serves as the contact pair ID for computational purposes. The parameters for a contact pair may define contact behavior (e.g., frictionless, frictional, or bonded), material properties (e.g., rigid or flexible), contact types (e.g., symmetrical, asymmetrical, surface-to-surface, surface-to-line, line-to-line, etc.), for example.

As described above, finite element solutions of large contact pairs can be computationally demanding. If a large contact pair is assigned to one CPU core in a parallel processing system, then that CPU core will have all the information it needs to find a solution, but the overall solution will be slowed as other CPU cores complete their solutions and idle while the large contact pair solution is completed. In embodiments of the present disclosure, large contact pairs can be split into smaller sub-pairs and distributed across multiple CPU cores to balance the computational loads across the CPU cores. However, the CPU cores may not have all of the information needed to converge on a solution, depending on the type of contact detection methods used.

Gauss point detection uses the integrated area of a contact element and a contact normal of the contact element (in the direction of the contact) to detect contact. Nodal point detection relies on the average of the integrated areas of contact elements on either side of a selected contact node and the average of the contact normals of the contact elements on either side of the selected contact node. Mortar contact detection at a selected contact node relies on the average of contact element normals at contact nodes adjacent to the selected contact node, and the average of integrated areas of target elements adjacent to the contact node. Because the contact normals at the adjacent nodes are averages of the adjacent contact element normals and the next adjacent contact element normals, the mortar contact detection method requires information from contact elements that are both first adjacent and second adjacent to the selected contact node.

FIGS. 1A, 1B and 1C illustrate three different contact detection methods, FIG. 1A illustrates an example of 2-point Gauss point contact detection using two Gauss integration points per contact segment (each Gauss point indicated by an X). In FIG. 1A, contact surface 10, including contact elements (segments) 11, 12, 13 and 14, is in contact with target surface 20. In particular, FIG. 1A illustrates that contact elements 12 and 13 are in physical contact with target surface 20.

FIG. 1B illustrates an example of nodal point contact detection between a contact surface 30, including contact elements 31, 32, 33 and 34, and nodes a, b, c, d and e, and the target surface 20. FIG. 1B illustrates that node c is in physical contact with target surface 20.

FIG. 1C illustrates an example of surface projection contact detection, also known as mortar contact detection. As illustrated in FIG. 1C, mortar contact detection is used when the contact and target surfaces have non-conforming mesh elements, In FIG. 1C, contact surface mesh 40 does not conform to target surface mesh 50. For example, contact element 41 and target element 51 may have different surface normals (n), different areas and different orientations. The mortar contact detection algorithm projects the area of the contact element 41 onto the target element 51 to define the common projected area 52, which maps to a projected area mesh element. This process is repeated until the entire contact surface is remapped with the projected areas.

Figure 3:
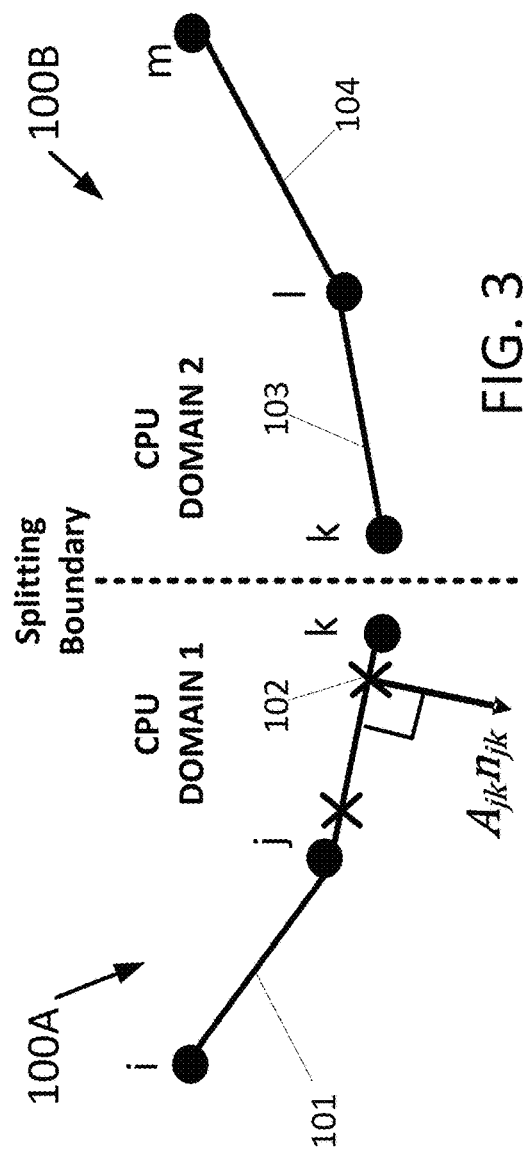
FIG. 3 illustrates an example of Gauss point detection in a contact sub-pair at a splitting boundary.

FIG. 2 illustrates an example of Gauss point contact detection for a contact surface 100 in two dimensions. In FIG. 2, contact elements 101 (segment i-j), 102 (segment j-k), 103 (segment k-l), and 104 (segment l-m) are contiguous contact surface elements. Each segment can be characterized by an integrated area and a contact normal as illustrated for contact element 102 in FIG. 1, where $n_{jk}$ is the unit normal to the surface of contact element 102 in the direction of contact, and $A_{jk}$ is the integrated area of contact element 102. It can be seen that all of the information needed to determine $n_{jk}$ and $A_{jk}$ is self-contained in contact element 102. If contact elements 101-104 were part of a contact pair that was split into sub-pairs at node k, as illustrated in FIG. 3, no information would be lost and the computation is unaffected.

However, the effect of splitting contact pairs into contact sub-pairs can be very different if a different contact detection algorithm is used. FIG. 4 illustrates an example of nodal point contact detection for the same contact surface 100 as shown in FIG. 2. As illustrated in FIG. 4, nodal point contact detection calculates a contact normal $n_k$ at node k as the average of contact normal $n_{jk}$ of contact element 102 and contact normal $n_{kl}$ of contact element 103, and an integrated area at node k as the sum of $A_{jk}$ and $A_{kl}$. If contact elements 101-104 were part of a contact pair that was split into sub-pairs 100A and 100B at node k, as illustrated in FIG. 5A and FIG. 5B, each CPU Domain (CPU Domain 1 and CPU Domain 2 in FIG. 5A and FIG. 5B) would lack information needed to find a solution. In the case of FIG. 5A, the contact normal and integrated area of contact element 103 would be missing from contact sub-pair 100A in CPU Domain 1. In the case of FIG. 5B, the contact normal and integrated area of contact element 102 would be missing from contact sub-pair 100B in CPU Domain 2. As described in greater detail below, this deficit can be remedied by augmenting the contact sub-pairs with data about the missing elements. In one embodiment, augmenting a contact sub-pair can associate this contact sub-pair with data containing or indicating, directly or indirectly, contact normal and/or integrated/projected area of contact elements related to this contact sub-pair. After each iteration in the solution phase, CPU Domain 1 will always have current values for the contact normal $n_k$ and integrated area $A_k$ of contact element 102. Similarly, CPU Domain 2 will always have current values for the contact normal $n_k$ and integrated area $A_k$ of contact element 103.

FIG. 6 illustrates an example of mortar contact between the contact surface 100 and a target surface 200 with non-conforming (i.e., different size) contact elements. The mortar contact method requires a calculation of the contact normal $n_k$ and projected area $A_k$ at node k. Computing the contact normal $n_k$ at node k requires the contact normal $n_{jk}$ of contact element j-k (102) and the contact normal $n_{kl}$ of contact element k-l (103). Computing the projected area $A_k$ at node k requires $n_j$, $n_k$, and $n_l$. However, since $n_j$ is the average of $n_{ij}$ and $n_{jk}$, and $n_l$ is the average of $n_{kl}$ and $n_{lm}$, contact elements i-k (101) and l-m (104) are also required for a solution at node k. Accordingly, if the contact pair 100/200 is split into a sub-pair at node k, as illustrated in FIG. 7A and FIG. 7B, then CPU Domain 1 will require state information on contact elements k-l (103) and l-m (104) at each iteration from CPU Domain 2. Similarly, CPU Domain 2 will require state information on contact elements i-j (101) and j-k (102) at each iteration from CPU Domain 1.

To summarize the foregoing description, Gauss point contact detection at a splitting boundary in a contact sub-pair is self-contained and does not require any information regarding contact elements from an adjacent sub-pair. Nodal point contact detection at a splitting boundary in a contact sub-pair requires information from one row of contact elements from adjacent sub-pairs at the split boundaries. And mortar contact detection at a splitting boundary in a contact sub-pair requires information from two rows of contact elements in adjacent sub-pairs at the splitting boundaries.

Figure 8:
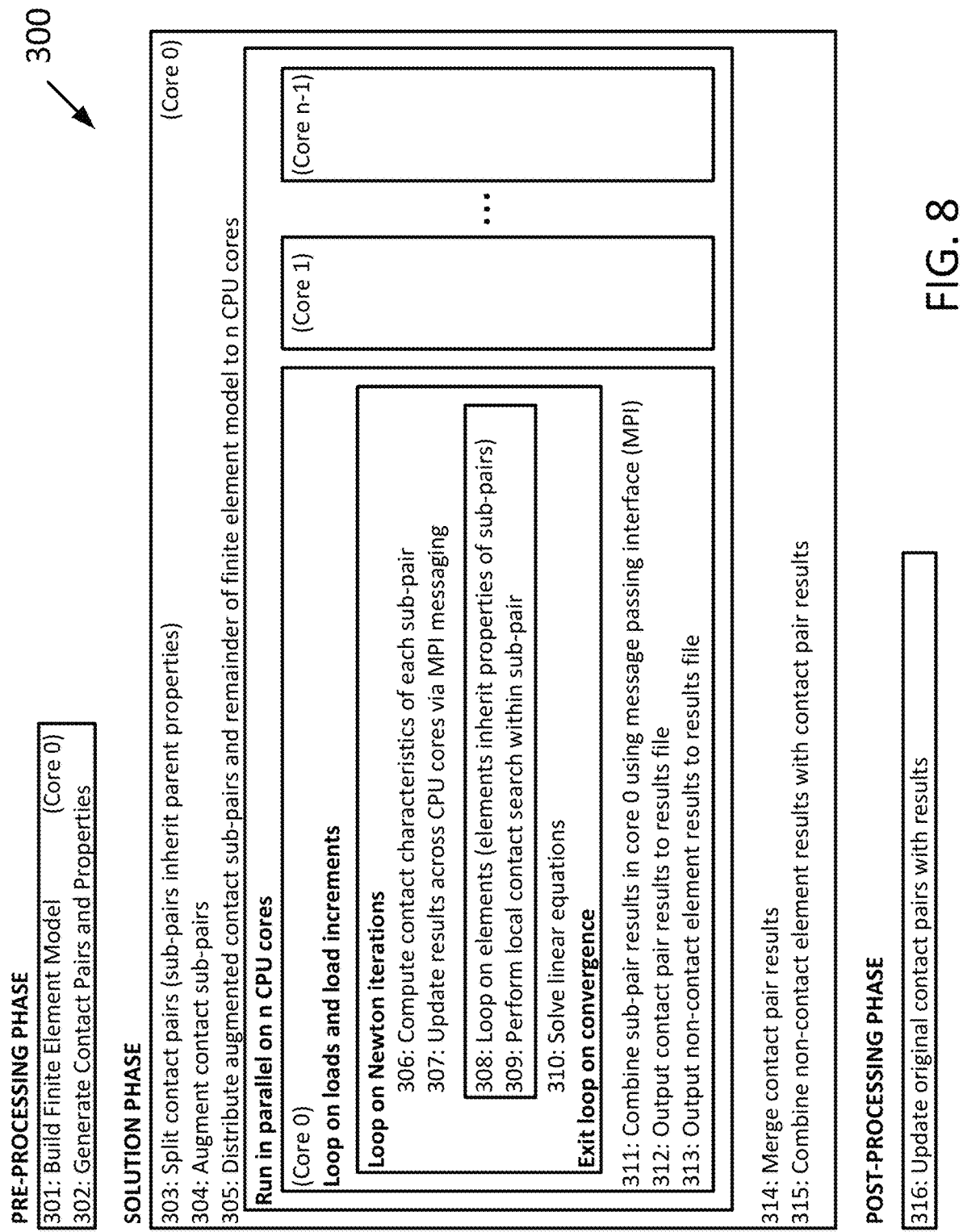
FIG. 8 is a flowchart illustrating an example process for modeling contact pairs in a distributed processing environment.

FIG. 8 is a flowchart illustrating an example process 300 for modeling contact pairs in a distributed processing environment with n CPU cores. Process 300 begins in a pre-processing phase in one CPU core (e.g., Core 0 as illustrated in FIG. 8) with operation 301, building the finite element model. Process 300 continues in the pre-processing phase in operation 302 by generating contact pairs in the model, associating each contact pair with a set of constants that identifies the properties of each contact pair, determining if a contact pair is an asymmetrical or symmetrical contact pair (for generating companion pairs), and assigning an ID (identifying) number to each contact surface and each target surface.

A solution phase in process 300 begins with operation 303, where the contact pairs are split into contact sub-pairs ("sub-pairs"). The sub-pairs inherit the properties of their parent contact pairs (i.e. the contact pair from which these sub-pairs are split) and are assigned an ID that links the contact and target surfaces of the sub-pair to their parent contact and target surfaces. Contact pair properties are a set of real constants associated with each pair ID. This approach provides a linked-list data structure that allows split contact sub-pairs to be reassembled to their original contact pairs after the solution phase.

Figure 9:
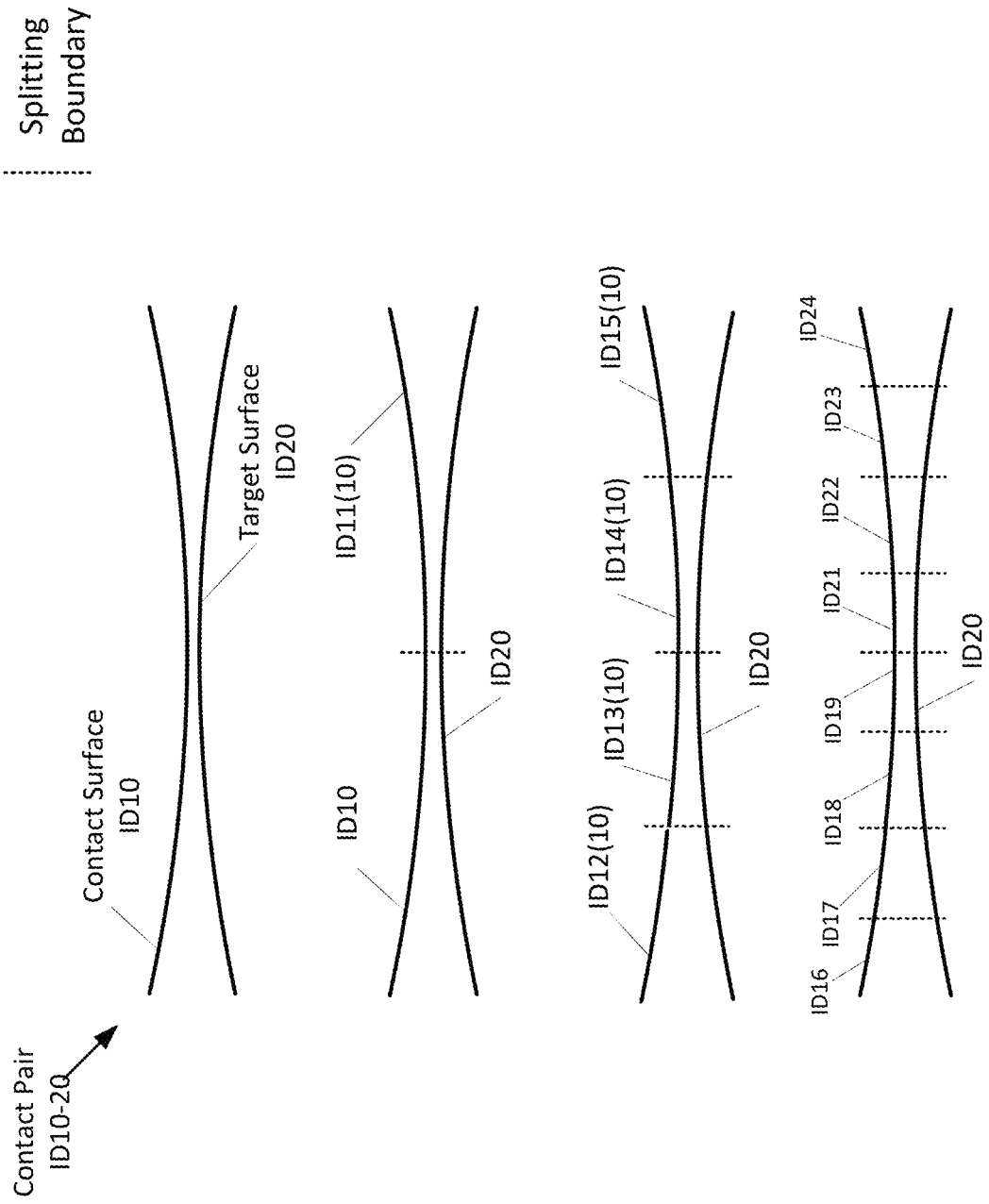
FIG. 9 illustrates an example of contact pair splitting.

FIG. 9 illustrates an example of contact pair splitting. In FIG. 9, an original contact pair ID10-20 includes a contact surface with ID10 and a target surface with ID10 before splitting. These surfaces could be contact surface 10 and target surface 20 from FIG. 1, for example. If a contact pair is split, each sub-divided pair is assigned a new pair ID. The first sub-pair is made of a subdivided contact surface and the entire original target surface.

After splitting, the resulting sub-pairs can be identified by a parameter that is the ID of the parent contact pair. The first sub-pair consists of a sub-divided contact surface (e.g., ID10 and ID11(10) in FIG. 9), the entire original target surface (e.g., ID10 in FIG. 9) and a duplicated target surface (e.g., ID11(10) in FIG. 9). Each subsequent split generates sub-pairs with new IDs. Each sub-pair consists of a newly created target surface that is a copy of the original target surface as illustrated in FIG. 9

In one embodiment, an algorithm may be used to determine the number of splits based on the number of contact elements in the largest contact pair in the finite element model, the total number of elements in the model, and the number of CPU cores in the processing system. In one example, the maximum number of splits (splitting levels) for the largest contact pair may be given by equation (1):

$$\text{Max no. of splits} = \frac{(\text{no. of CPU cores})*}{\min(\text{no. of contact elements in the model}, 4 *} \qquad (1)$$
$$(\text{no. of contact elements in largest contact pair})}$$

In one example, the number of splits for all other contact pairs may be given by equation (2):

$$\text{No. of splits} = \frac{(\text{max no. of splits})*}{(\text{no. of contact element in the contact pair})} \qquad (2)$$
$$\text{(no. of contact elements in the largest contact pair)}$$

Combining equations (1) and (2), the number of splits for any non-largest contact pair is given by equation (3):

$$\text{No. of splits} = \frac{(\text{no. of CPU cores})*}{\min(\text{no. of contact elements in the model},} \qquad (3)$$
$$\text{no. of contact elements in largest contact pair)}}$$

The ratio of equation (1) to equation (2) or equation (3) is an expression of load balance amount the CPUs, where a ratio of 1:1 reflects a perfect load balance, a ratio of approximately 1.5:1 represents a nominal load balance, and a ratio greater than 2:1 requires a higher splitting level and/or a greater number of CPU cores.

It will be appreciated that FIG. 9 provides only a simplified example to demonstrate the concept of splitting levels, and that embodiments of the present disclosure may support many more splitting levels based on the number of CPU cores.

Returning to FIG. 8, the process 300 continues at operation 304, where the contact sub-pairs are augmented with shared contact elements from adjacent contact sub-pairs at the splitting boundaries. As described above, the number (i.e., degree or rank-order) of shared contact elements (or the number of rows of contiguous contact elements) depends on the contact detection algorithm (e.g., Gauss point detection, nodal point detection, and mortar contact detection). In the context of the present disclosure, the augmentation concept is only applied to split contact surfaces and is not applied to other elements in the finite element model. In operation 305, contact sub-pairs associated with bonded and small sliding contact types are automatically trimmed from the model to reduce unnecessary computations.

In operation 306, the augmented sub-pairs are distributed among the CPU cores (including CPU Core 0 in one embodiment) to begin parallel processing. Each CPU core begins loops on loads and load increments, and Newton iterations. In each iteration, the characteristics of each contact sub-pair are successively approximated (operation 307) and the characteristics are unified among the sub-pairs using a message passing protocol (e.g., MPI) between the CPU cores (operation 308). An interior loop at the element level begins at operation 309 where each contact element inherits the properties of its associated sub-pair, and continues at operation 310 where a search for local contact within each sub-pair. The element results are used in operation 311 to approximate solutions to the set of linear equations representing the contact sub-pair (and non-contact elements as well), and exits the loops on convergence. In operation 312, the sub-pair results from across all of the CPU cores are combined in Core 0 (using the message passing protocol), where the contact pairs are assembled (using the sub-pair IDs as described above). In operation 313, the contact pair results are output to a results file, and in operation 314, the non-contact element results are output to the results file. In operation 315, the contact pair results are merged, and in operation 316, the contact pair and non-contact elements results are combined in a final solution. Finally, in operation 317 in a post-processing phase, the original contact pairs are updated with the simulation results.

Figure 10:
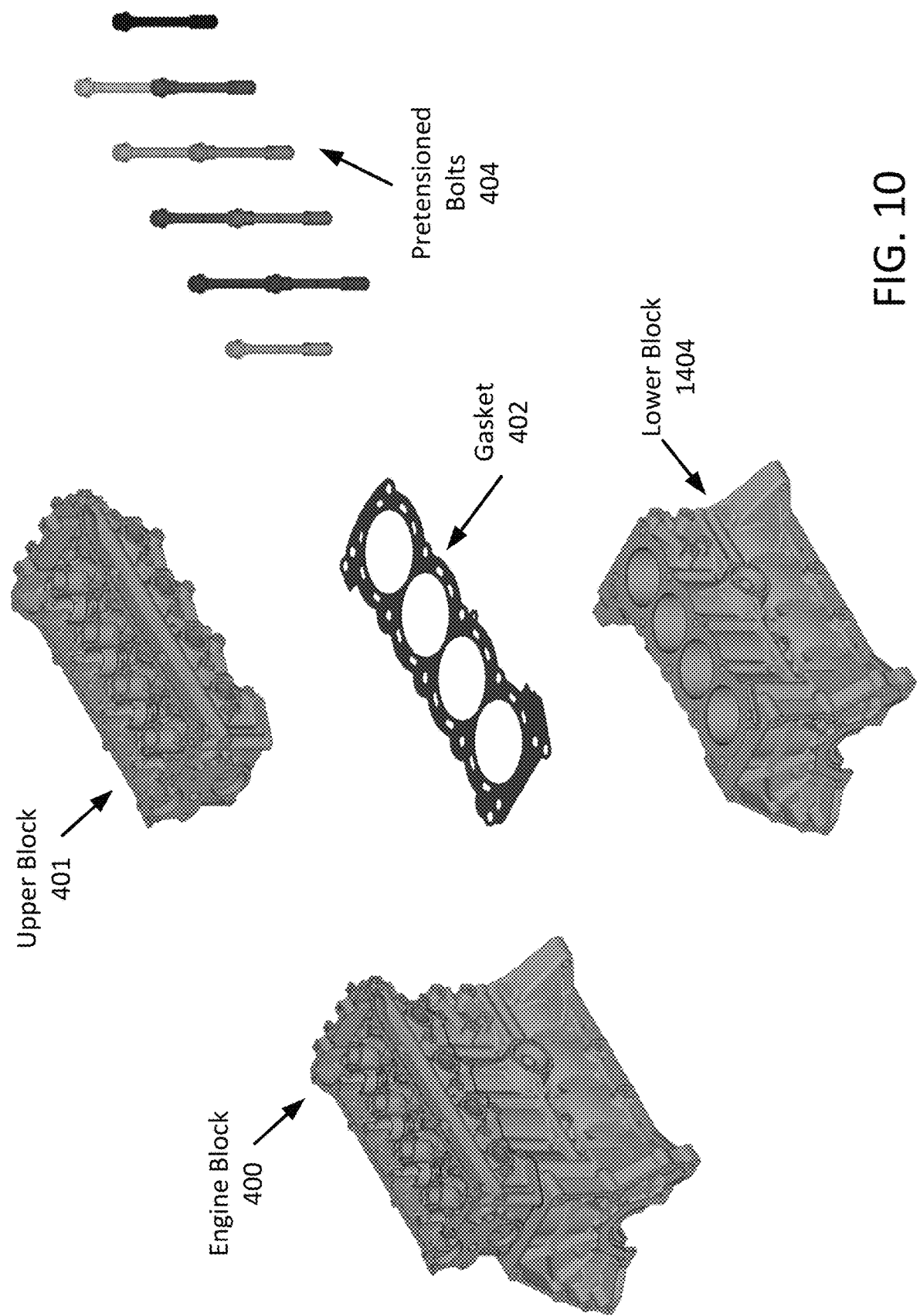
FIG. 10 illustrates an example of a finite element model.

FIG. 10 illustrates an example of a finite element model of an engine block 400 that may be built, for example, in operation 301 of process 300. In one example, engine block 400 includes an upper block 401, a gasket 402, a lower block 403, and a set of pretensioned bolts 404 to apply a compressive force on the gasket 402. A model such as Engine Block 400 may have millions of elements and hundreds of contact pairs. For the purpose of the present disclosure, however, five symmetric contact pairs can be defined as follows, corresponding to operation 302 in process 300: bolt side to lower block, bolt head to upper block, gasket to lower block, gasket to upper block, and bolt side to upper block as illustrates in FIG. 11. The substructure 500 of engine block 400 with these contact pairs is illustrated schematically and in tabular form (Table 1) in FIG. 11. Each contact pair is assigned a pair of IDs representing the contact surface and the target surface. Note that there will also be five companion pairs (not shown) because the original (base) pairs are defined as symmetric in this example. Each surface is also characterized by a contact behavior such as bonded or standard (i.e., only compressive contact stresses are allowed). Other contact behaviors may include frictionless or frictional, for example. Because the pairs are defined as symmetric, each surface has a target surface that, in this example, is defined as flexible for every target surface. Finally, the contact type for each surface is defined, which in this example is surface-to-surface for all of the contact pairs.

Figure 12:
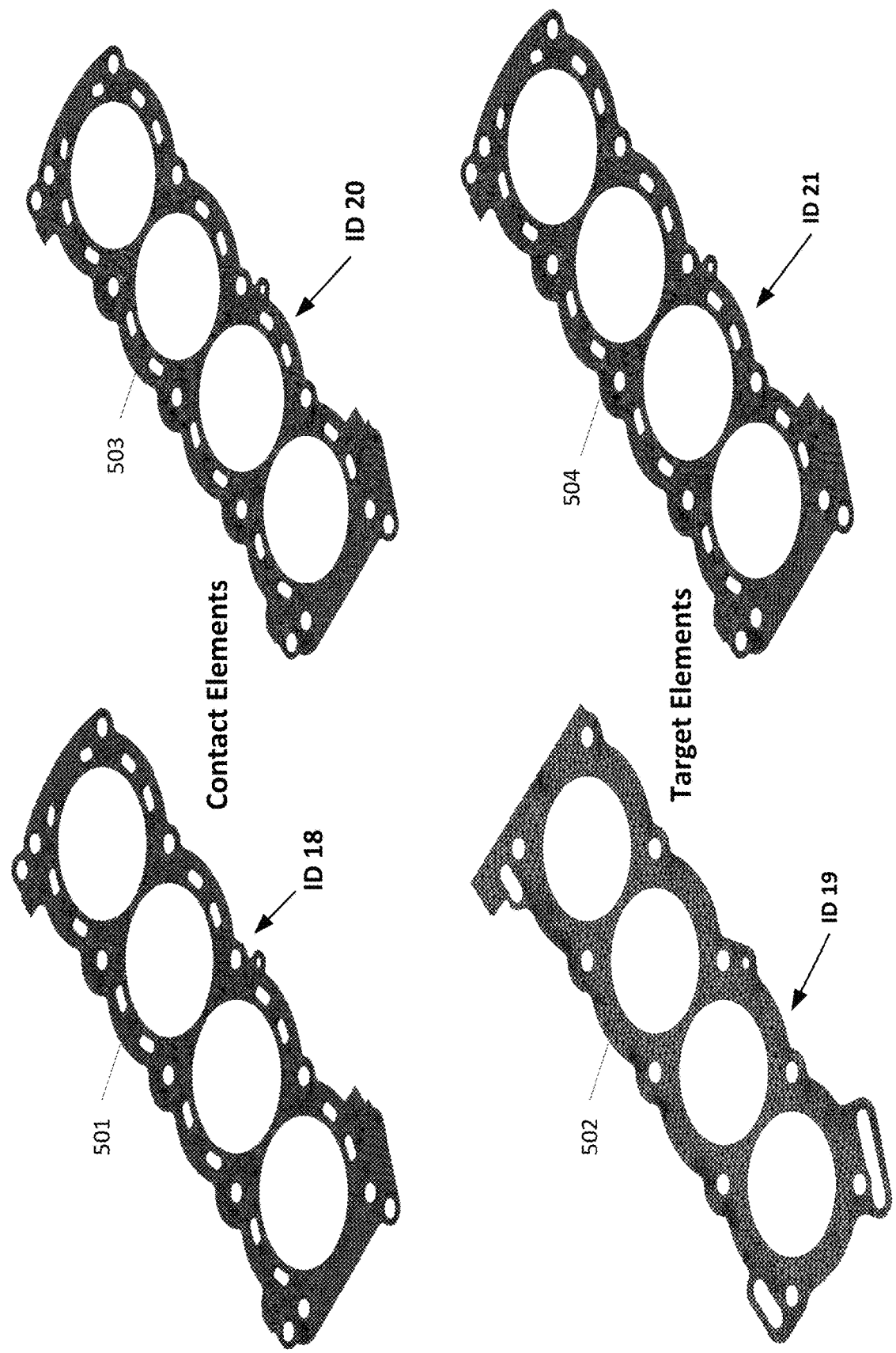
FIG. 12 illustrates an example of finite element discretization of contact pairs.

FIG. 12 illustrates the finite element mesh discretization of contact pairs 18 (gasket to lower block) and 20 (gasket to upper block). In FIG. 12, surface 501 is the contact surface of the gasket (ID 18) and surface 502 is the target surface of the lower block (ID 18). Similarly, surface 503 is the contact surface of the gasket (ID 20) and surface 504 is the target surface of the upper block (ID 20).

FIG. 13 illustrates the substructure 500 after splitting the according to operation 303 in process 300, into 19 asymmetric pairs that can be split and delivered to different CPU cores. In FIG. 13, gasket contact surface 18 has been split into eight (8) contact sub-pairs, IDs 18 and 48-54. Gasket contact surface 20 has also been split into eight (8) contact sub-pairs IDs 20 and 55-61 as illustrated in Table 2. As described above, in one embodiment, the first contact sub-pair in a split contact surface retains the ID of the original contact surface, which provides a pointer for reassembly of the contact pair after sub-pair solutions have been achieved. Note also in the example of FIG. 13, that contact pairs 15, 17, 19, 21 and 23 have been deleted (trimmed) because they do not actually make contact.

Figure 14:
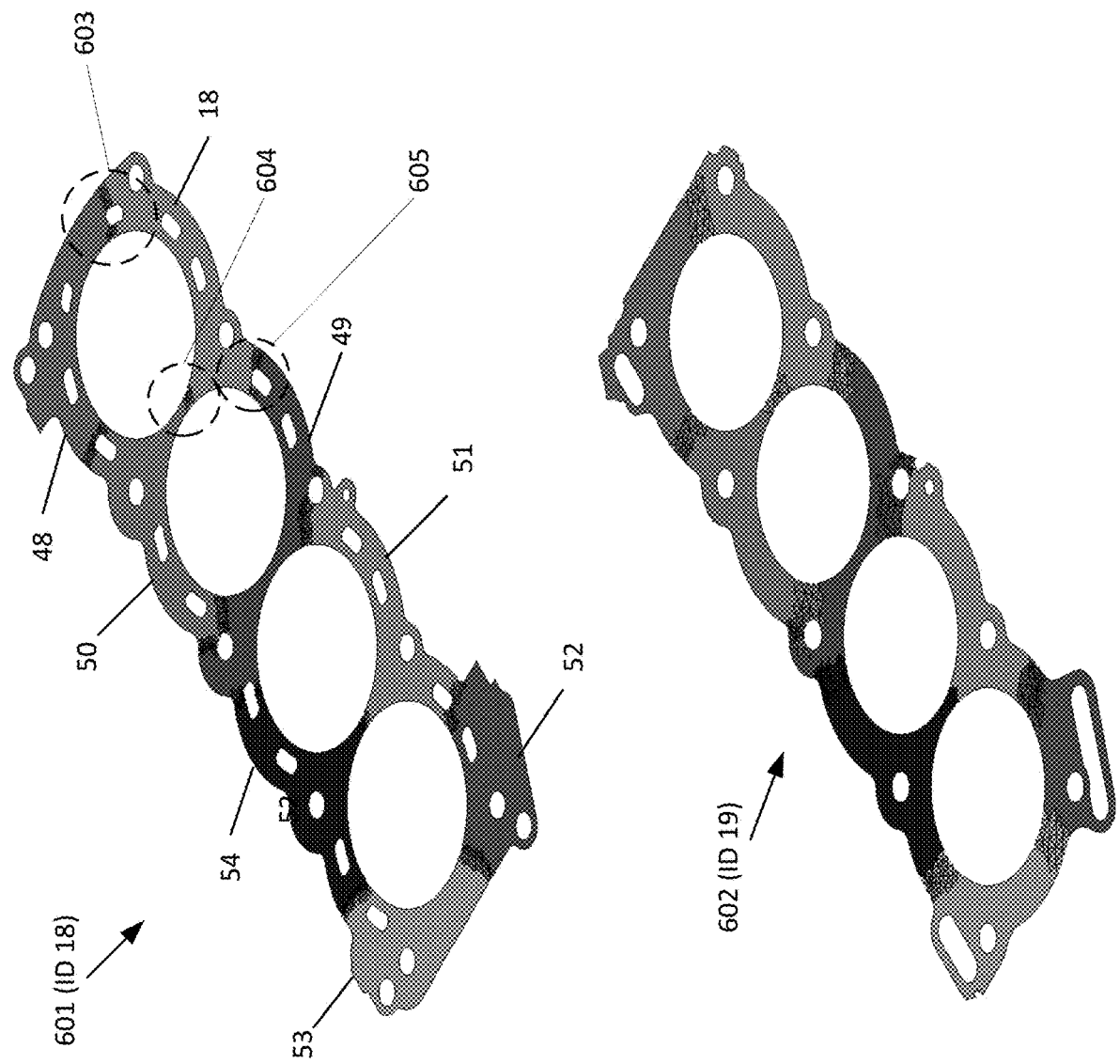
FIG. 14 illustrates an example of contact surface splitting and target surface splitting with shared contact element augmentation at the splitting boundaries.
Figure 15:
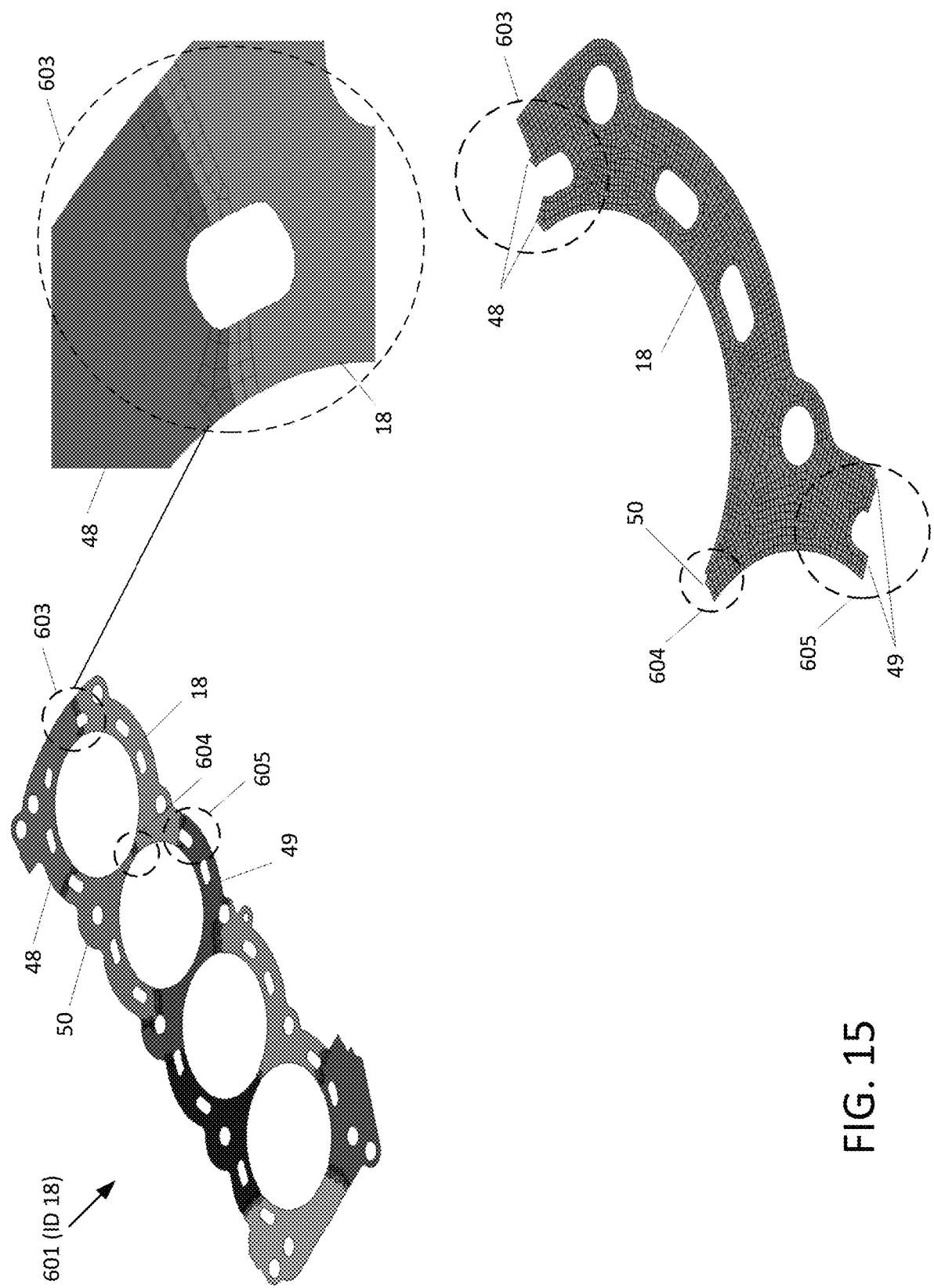
FIG. 15 illustrates a magnified view of splitting boundaries of the split contact surface of FIG. 14.

FIG. 14 illustrates split contact surface 601 (ID 18) and split target surface 602 (ID 18), where the contact sub-pairs of contact pair ID 18 are provided as numbers without an ID to distinguish the sub-pairs from the parent contact surface. The split sub-pairs in target surface side ID 18, ID48 through ID54 are illustrated but not labeled to avoid clutter. Each split target surface is trimmed off due to a small sliding contact definition in this example (corresponding to operation 305 of process 300. It can be seen in FIG. 14, at the split boundaries between the split contact sub-pair 18 and its contiguous contact sub-pairs 48, 49 and 50 (e.g., boundaries 603, 604 and 605), that there is a zone of highlighted contact elements on either side of the splitting boundaries. These are the augmenting, or shared contact elements described above (corresponding to operation 304 of process 300), used to insure that the solutions reached using split contact sub-pairs in domain decomposition are the same the would be achieved without splitting. These zones of shared, augmenting elements are expanded for clarity in FIG. 15. In FIG. 15, the splitting boundaries 603, 604 and 605 are shown as augmented with 2 ranks (rows) of contact elements from the adjacent sub-pair. As described above, this order of augmentation corresponds to a requirement for mortar contact detection.

Figure 16:
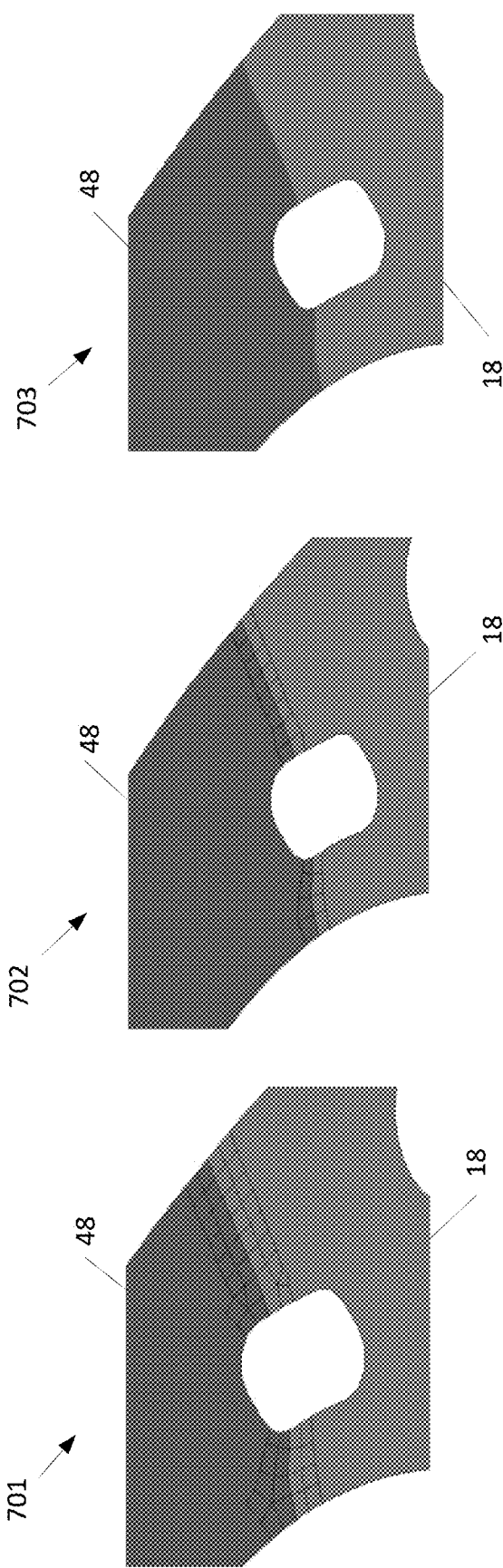
FIG. 16 illustrates additional examples of shared contact element augmentation at a splitting boundary of the split contact surface of FIG. 14.

FIG. 16 illustrates three example levels of augmentation associated with the different contact detection methods. At the splitting boundary between contact sub-pair 18 and contact sub-pair 48, illustrated by example 701, there are two rows (ranks) of shared contact elements on each side of the splitting boundary, corresponding to mortar contact detection as previously described. At the splitting boundary between contact sub-pair 18 and contact sub-pair 48, illustrated by example 702, there is one row (rank) of shared contact elements on each side of the splitting boundary, corresponding to nodal point contact detection. At the splitting boundary between contact sub-pair 18 and contact sub-pair 48, illustrated by example 703, there are zero rows (ranks) of shared contact elements on each side of the splitting boundary, corresponding to Gauss point contact detection.

Figure 17:
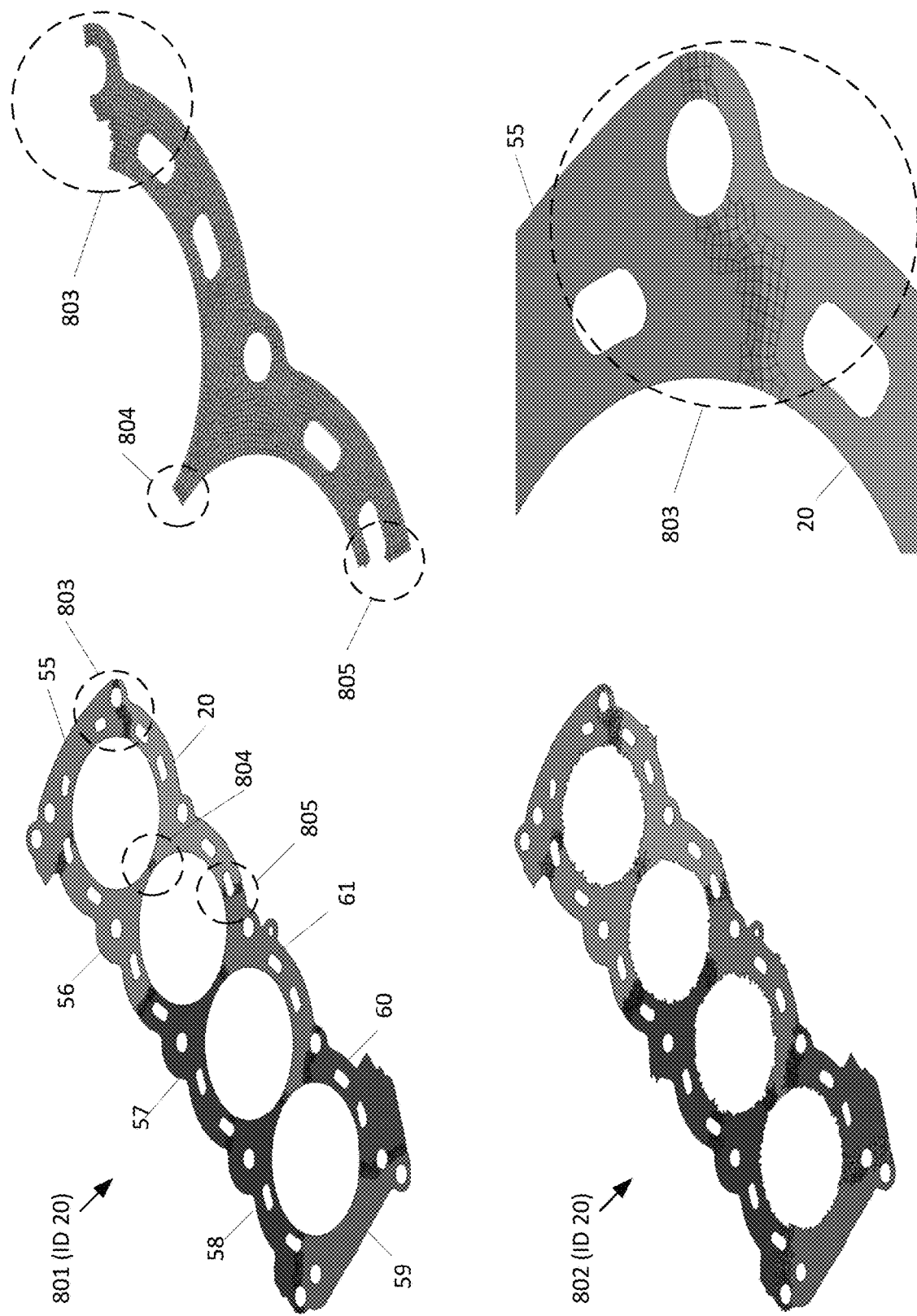
FIG. 17 illustrates another example of a split contact surface.

FIG. 17 illustrates split contact surface 801 (ID 20) and split target surface 802 (ID 20), where the contact sub-pairs of contact pair ID 20 are provided as numbers without an ID to distinguish the sub-pairs from the parent contact surface. The split sub-pairs in target surface side ID 20 are illustrated but not labeled to avoid clutter. Each split pair is trimmed off due to a bonded contact definition in this example (corresponding to operation 305 of process 300). It can be seen in FIG. 17, at the split boundaries between the split contact sub-pair 20 and its contiguous contact sub-pairs 48, 49 and 50 (boundaries 803, 804 and 805), that there is a zone of highlighted contact elements on either side of the splitting boundaries. As described above with respect to FIG. 14, these are the augmenting, or shared contact elements described above.

Referring back to process 300 in FIG. 8, after the solution phase (operations 307 through 314) completes, the contact sub-pairs are merged in operation 314. This operation is illustrated in FIG. 18 where, for example, the shared contact elements are the splitting boundaries (803, 804, and 805 for example) are removed, and the contact sub-pairs of contact surface ID 20 (20 and 55-61) are merged into the original contact surface ID 20.

Figure 19:
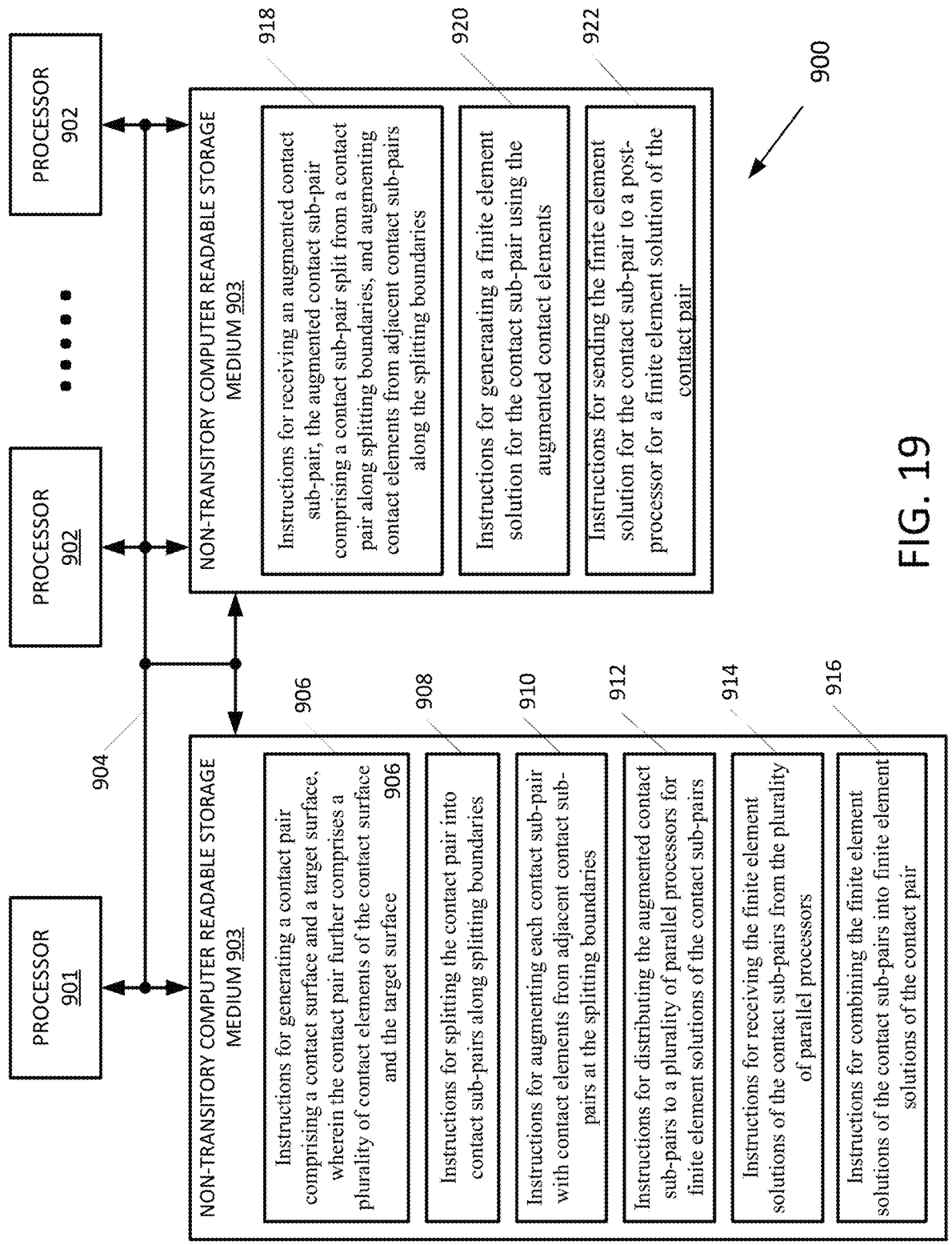
FIG. 19 is a block diagram illustrating an example system with computer readable storage media for DMP processing of finite elements based on contact pair splitting.

FIG. 19 is a block diagram of an example system 900 for DMP processing of finite elements based on contact pair splitting. In one embodiment, example system 900 includes a processor 901 corresponding to CPU core 0 in FIG. 8, for example) and a plurality of processors 902 (corresponding to CPU cores 1 through n−1 in FIG. 8, for example). Processors 901 and 902 may be any type of processor, such as general purpose processors, controllers, special purpose logic, or the like. System 900 also includes one or more non-transitory computer-readable storage mediums 903 including instructions, that when executed by one or more processors, cause the one or more processors to perform distributed-memory parallel (DMP) processing of finite elements based on contact pair splitting. The computer-readable storage media may be any type of storage device or system including, without limitation, random access memory (RAM), read only memory (ROM), programmable ROM (PROM), electrically erasable PROM (EEPROM), or the like. Processors 901 and 902, and computer-readable storage mediums 903 may be interconnected by network 904, which may be any type of network including, without limitation a wired and wireless local area network (LAN), wide area network (WAN), metropolitan area network (MAN), the Internet, or the like.

In one embodiment, the non-transitory computer readable medium (CRM) 903 may provide instructions 906 through 918 for processor 901. In one embodiment, CRM 903 includes instruction 906 for generating a contact pair comprising a contact surface and a target surface, wherein the contact pair further comprises a plurality of contact elements of the contact surface and the target surface; instruction 908 for splitting the contact pair into contact sub-pairs along splitting boundaries; instruction 910 for augmenting each contact sub-pair with contact elements from adjacent contact sub-pairs at the splitting boundaries; instruction 912 for distributing the augmented contact sub-pairs to a plurality of parallel processors for finite element solutions of the contact sub-pairs; instruction 914 for receiving the finite element solutions of the contact sub-pairs from the plurality of parallel processors; and instruction 916 for combining the finite element solutions of the contact sub-pairs into finite element solutions of the contact pair.

In one embodiment, CRM 903 may include additional instructions for determining a number of splitting levels of a largest contact pair based on a count of the parallel processors (e.g. processors 901 and 902), a number of contact elements in the largest contact pair, and a total number of elements in the model, and determining a number of splitting levels of other contact pairs based on the number of splitting levels of the largest contact pair, a number of contact elements in the other contact pairs, and the number of contact elements in the largest contact pair.

In one embodiment, the non-transitory computer readable medium (CRM) 903 includes example instructions 918 through 922 for processor 902. In one embodiment, CRM 903 includes instruction 918 for receiving, from a preprocessor (e.g., processor 901), an augmented contact sub-pair, the augmented contact sub-pair comprising a contact sub-pair split from a contact pair along splitting boundaries, and augmenting contact elements from adjacent contact sub-pairs along the splitting boundaries; instruction 920 for generating a finite element solution for the contact sub-pair using the augmented contact elements; and instruction 922 for sending the finite element solution for the contact sub-pair to a post-processor (e.g., processor 901) for a finite element solution of the contact pair.

Figure 20:
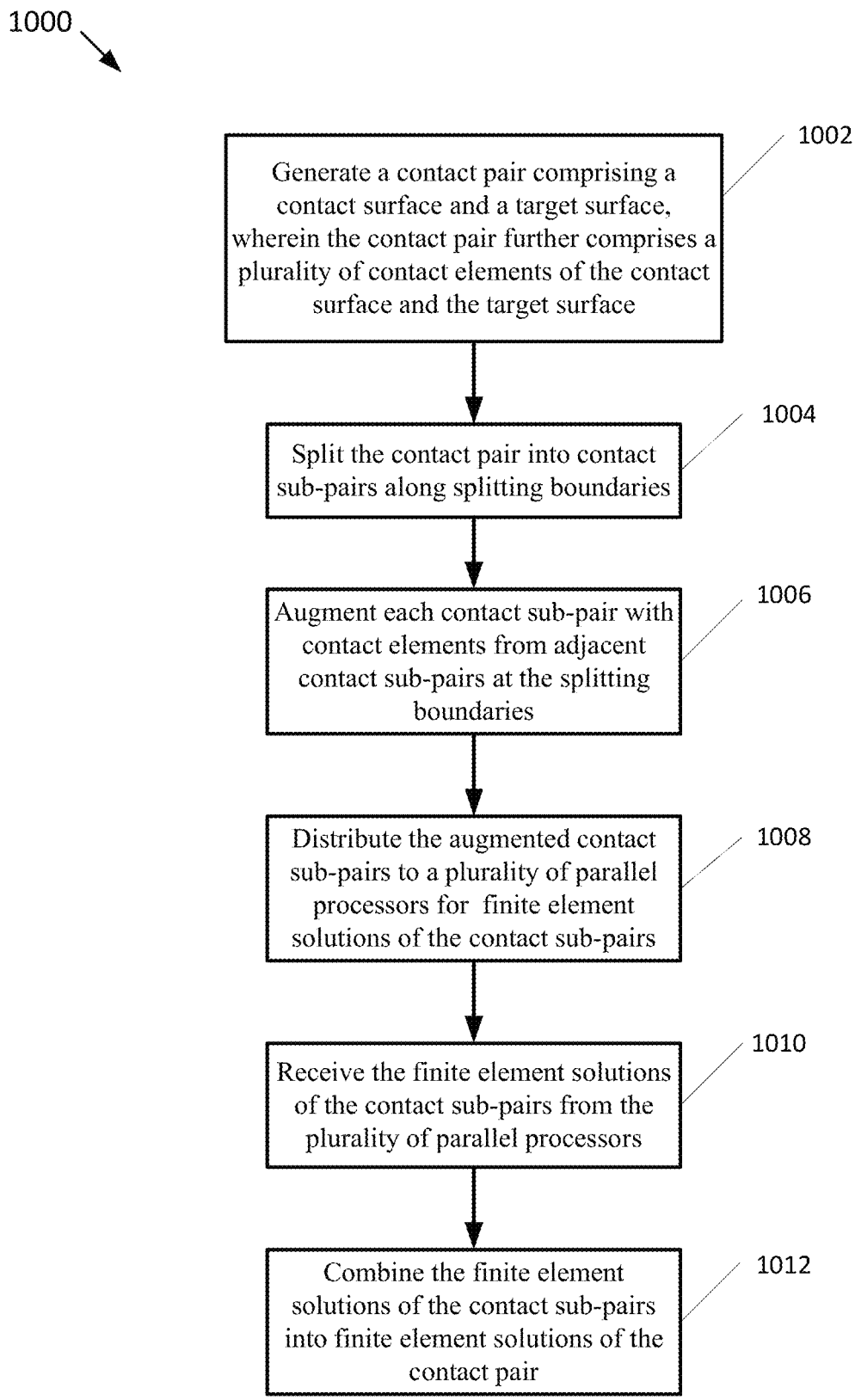
FIG. 20 is a flowchart illustrating an example method for DMP processing of finite elements based on contact pair splitting.

FIG. 20 is a flowchart illustrating an example method 1000 for DMP processing of finite elements based on contact pair splitting. Method 1000 begins at operation 1002, generating, in a first processor (e.g., processor 901), a contact pair comprising a contact surface and a target surface, wherein the contact pair further comprises a plurality of contact elements of the contact surface and the target surface. Method 1000 continues at operation 1004, splitting the contact pair into contact sub-pairs along splitting boundaries. Next, operation 1006 augments each contact sub-pair with contact elements from adjacent contact sub-pairs at the splitting boundaries. Operation 1008 distributes the augmented contact sub-pairs to a plurality of parallel processors (e.g., processors 902) for finite element solutions of the contact sub-pairs. In operation 1010, the first processor (e.g., processor 901) receives the finite element solutions of the contact sub-pairs from the plurality of parallel processors, in operation 1012, combining the finite element solutions of the contact sub-pairs into finite element solutions of the contact pair.

In other embodiments, method 1000 may include other operations (not shown), such as determining a number of splitting levels of a largest contact pair based on a count of the parallel processors, a number of contact elements in the largest contact pair, and a total number of elements in the model, and determining a number of splitting levels of other contact pairs based on the number of splitting levels of the largest contact pair, a number of contact elements in the other contact pairs, and the number of contact elements in the largest contact pair.

In one embodiment of method 1000, the contact elements from adjacent contact sub-pairs may comprise contiguous contact elements from the adjacent contact sub-pairs at the splitting boundaries, where a rank-order (i.e., the number of rows) of the contiguous (shared) contact elements may depend on a method of contact detection.

In one embodiment of method 1000, the method of contact detection may be based on Gauss-point contact detection, nodal-point contact detection, mortar contact detection, or other applicable contact detection mechanisms. Rows of contiguous contact elements to be shared from adjacent contact sub-pairs at the splitting boundaries may be identified according to the method of contact detection applied. For example, a zero-order rank of contiguous contact elements may be identified at the splitting boundary of a contact pair detected via a Gauss point contact detection, a first-order rank of contiguous contact elements identified at the splitting boundary of a contact pair detected via a nodal-point contact detection, and a second-order rank of contiguous contact elements identified at the splitting boundary of a contact pair identified via a mortar contact detection method, etc.

In one embodiment of method 1000, each contact sub-pair inherits a set of contact properties from its parent contact, the contact properties associated with a contact pair identifier.

In one embodiment of method 1000, the plurality of parallel processors includes the first processor.

Figure 21:
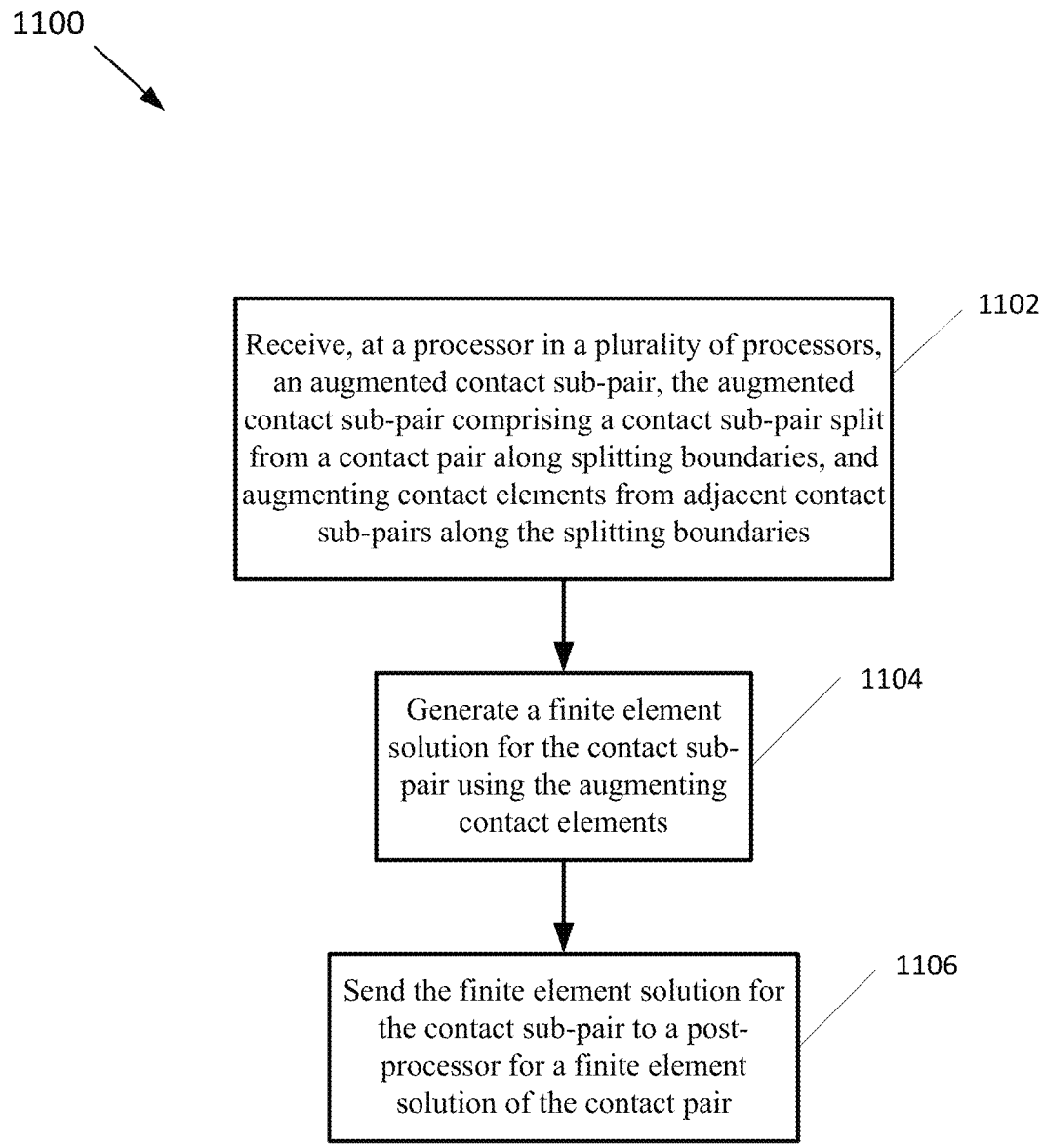
FIG. 21 is a flowchart illustrating another example method for DMP processing of finite elements based on contact pair splitting.

FIG. 21 is a flowchart illustrating an example method 1100 for DMP processing of finite elements based on contact pair splitting. Method 1100 begins at operation 1102, receiving from a preprocessor (e.g., processor 901), at a processor in a plurality of processors (e.g., processors 902), an augmented contact sub-pair, the augmented contact sub-pair comprising a contact sub-pair split from a contact pair along splitting boundaries, and augmenting contact elements from adjacent contact sub-pairs along the splitting boundaries. Method 1100 continues at operation 1104, generating a finite element solution for the contact sub-pair using the augmented contact elements. Method 1100 concludes with operation 1106, sending the finite element solution for the contact sub-pair to a post-processor (e.g., processor 901) for a finite element solution of the contact pair.

In one embodiment of method 1100, the augmenting contact elements from the adjacent contact sub-pairs comprise contiguous contact elements from the adjacent contact sub-pairs along the splitting boundaries, where a rank-order of the contiguous contact elements corresponds to a method of contact detection.

In one embodiment of method 1100, the method of contact detection comprises one of Gauss-point contact detection, nodal-point contact detection, and mortar contact detection, wherein Gauss-point detection corresponds to a zero-order rank of contiguous elements at the splitting boundary, nodal-point detection corresponds to a first-order rank of contiguous elements at the splitting boundary, and mortar contact detection corresponds to a second-order rank of contiguous elements at the splitting boundaries.

In one embodiment of method 1100, generating the finite element solution for the contact sub-pair includes receiving computed contact element characteristics of the augmenting contact elements from another processor on each iteration of a finite element solution, updating computed characteristics of the contact sub-pair based on the computed contact characteristics of the augmenting contact elements, and removing the augmenting contact elements from the finite element solution for the contact sub-pair.

The methods and systems described herein may be implemented using any suitable processing system with any suitable combination of hardware, software and/or firmware, such as described below with reference to the non-limiting example system 1200 illustrated in FIG. 22.

Figure 22:
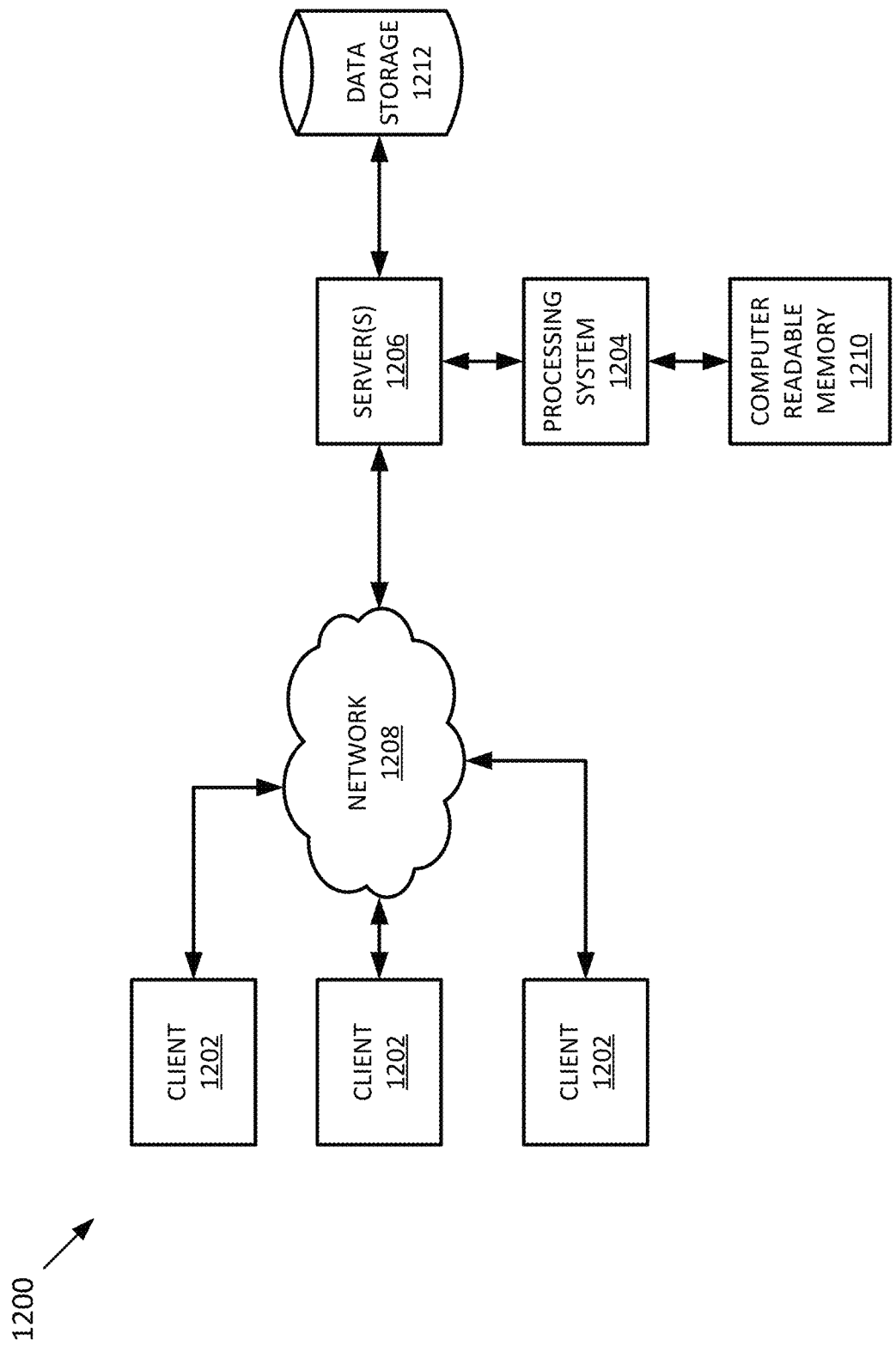
FIG. 22 is a block diagram illustrating another example system with computer readable storage media for DMP processing of finite elements based on contact pair splitting.

FIG. 22 illustrates a computer-implemented environment 1200 where clients 1202 can interact with a processing system 1204 hosted on one or more servers 1206 through a network 1208. The processing system 1204 may have access to a non-transitory computer-readable storage medium 1210 for operating system and program software and a data store 1212 for long-term data storage. Processing system 1204 may include multiple processors (e.g., multiple CPU cores) for parallel processing. In some embodiments, processing system 1204 may also be provided on a stand-alone computer for access by a user.

Processing system 1204 may perform calculations and logic operations required to execute a program. The non-transitory computer-readable storage medium may contain one or more programming instructions stored in RAM or ROM. Optionally, program instructions may be stored on a non-transitory computer-readable storage medium such as a magnetic disk, optical disk, recordable memory device, flash memory, or other physical storage medium. Computer instructions may also be communicated via a communications signal, or a modulated carrier wave, e.g., such that the instructions may then be stored on a non-transitory computer-readable storage medium.

The present disclosure describes various example embodiments, but other variations fall within scope of the disclosure. For example, systems and methods may include and utilize data signals conveyed via networks (e.g., local area network, wide area network, internet, intranet, or combinations thereof, etc.), fiber optic medium, carrier waves, wireless networks, etc. for communication with one or more data processing devices. The data signals can carry any or all of the data disclosed herein that is provided to or from a device.

The methods and systems described herein may be implemented on many different types of processing devices by program code comprising program instructions that are executable by the device processing system. The software program instructions may include source code, object code, machine code, or any other stored data that is operable to cause a processing system to perform the methods and operations described herein. Any suitable computer languages may be used such as C, C++, Java, etc. Other implementations may also be used, however, such as firmware or even appropriately designed hardware configured to carry out the methods and systems described herein.

The systems and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other non-transitory computer-readable media for use by a computer program.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive or" may be used to indicate situation where only the disjunctive meaning may apply.

What is claimed is:

1. A method for modeling contact pairs in a model of a physical object, comprising:
   generating, in a first processor, a contact pair comprising a contact surface and a target surface, wherein the contact pair further comprises a plurality of contact elements of the contact surface and the target surface;
   splitting the contact pair into contact sub-pairs along splitting boundaries;
   augmenting each contact sub-pair with the contact elements of the contact surface and the target surface from adjacent contact sub-pairs at the splitting boundaries;
   distributing the augmented contact sub-pairs to a plurality of parallel processors for finite element solutions of the contact sub-pairs;
   receiving the finite element solutions of the contact sub-pairs from the plurality of parallel processors; and
   combining the finite element solutions of the contact sub-pairs into finite element solutions of the contact pair.

2. The method of claim 1, further comprising:
   determining a number of splitting levels of a largest contact pair based on a count of the parallel processors, a number of contact elements in the largest contact pair, and a total number of elements in the model; and
   determining a number of splitting levels of other contact pairs based on the number of splitting levels of the largest contact pair, a number of contact elements in the other contact pairs, and the number of contact elements in the largest contact pair.

3. The method of claim 1, wherein the contact elements from adjacent contact sub-pairs comprise one or more rows of contiguous contact elements from the adjacent contact sub-pairs at the splitting boundaries.

4. The method of claim 3, further comprising:
  detecting the contact pair from the model of the physical object, wherein the one or more rows of contiguous contact elements are identified according to the detection of the contact pair.

5. The method of claim 1, wherein each contact sub-pair inherits a set of contact properties from a parent contact of said each contact sub-pair, the contact properties associated with a contact pair identifier.

6. The method of claim 1, wherein the plurality of parallel processors includes the first processor.

7. A method for modeling contact pairs in a model of a physical object, comprising:
  receiving from a preprocessor, at a processor in a plurality of processors, an augmented contact sub-pair comprising a contact sub-pair and augmenting contact elements, the contact sub-pair split from a contact pair along splitting boundaries, the augmenting contact elements from adjacent contact sub-pairs along the splitting boundaries, the augmented contact sub-pair received from the preprocessor for distributed generation of a plurality of finite element solutions via a plurality of contact sub-pairs of the contact pair;
  generating a finite element solution for the contact sub-pair using the augmenting contact elements; and
  sending the finite element solution for the contact sub-pair to a post-processor for combining the plurality of finite element solutions corresponding to the plurality of contact sub-pairs into a finite element solution of the contact pair.

8. The method of claim 7, wherein the augmenting contact elements from the adjacent contact sub-pairs comprise contiguous contact elements from the adjacent contact sub-pairs along the splitting boundaries, and wherein the generation of the finite element solution comprises determining a contact normal for a contact element along a splitting boundary of the contact sub-pair.

9. The method of claim 8, wherein the contact normal is determined based on the augmenting contact elements.

10. The method of claim 8, wherein generating the finite element solution for the contact sub-pair further comprises:
  receiving computed contact element characteristics of the augmenting contact elements from another processor on each iteration of a finite element solution;
  updating computed characteristics of the contact sub-pair based on the computed contact characteristics of the augmenting contact elements; and
  removing the augmenting contact elements from the finite element solution for the contact sub-pair.

11. The method of claim 7, wherein the plurality of processors includes the pre-processor.

12. A system for modeling contact pairs in a model of a physical object, comprising:
  a first processor configured to:
    generate, in a first processor, a contact pair comprising a contact surface and a target surface, wherein the contact pair further comprises a plurality of contact elements of the contact surface and the target surface;
    split the contact pair into contact sub-pairs along splitting boundaries;
    augment each contact sub-pair with the contact elements of the contact surface and the target surface from adjacent contact sub-pairs at the splitting boundaries;
    distribute the augmented contact sub-pairs to a plurality of parallel processors for finite element solutions of the contact sub-pairs;
    receive the finite element solutions of the contact sub-pairs from the plurality of parallel processors; and
    combine the finite element solutions of the contact sub-pairs into finite element solutions of the contact pair.

13. The system of claim 12, further comprising a second processor in a plurality of processors, configured to:
  receive from the first preprocessor, at a processor in a plurality of processors, an augmented contact sub-pair, the augmented contact sub-pair comprising a contact sub-pair split from a contact pair along splitting boundaries, and augmented contact elements from adjacent contact sub-pairs along the splitting boundaries;
  generate a finite element solution for the contact sub-pair using the augmented contact elements; and
  send the finite element solution for the contact sub-pair to a post-processor for a finite element solution of the contact pair.

14. The system of claim 12, wherein the first processor is further configured to:
  determine a number of splitting levels of a largest contact pair based on a count of the parallel processors, a number of contact element in the largest contact pair, and a total number of elements in the model; and
  determine a number of splitting levels of another contact pair based on the number of splitting levels of the largest contact pair, a number of contact elements in the other contact pair, and the number of contact elements in the largest contact pair.

15. The system of claim 13, wherein to generate the finite element solution for the contact sub-pair, the second processor is configured to:
  receive computed contact element characteristics of the augmenting contact elements from another processor on each iteration of a finite element solution;
  update computed characteristics of the contact sub-pair based on the computed contact characteristics of the augmenting contact elements; and
  remove the augmenting contact elements from the finite element solution for the contact sub-pair.

16. The system of claim 12, wherein the contact elements from adjacent contact sub-pairs comprise contiguous contact elements from the adjacent contact sub-pairs at the splitting boundaries, and wherein a rank-order of the contiguous contact elements corresponds to a method of contact detection.

17. The system of claim 16, wherein the method of contact detection comprises one of Gauss-point contact detection, nodal-point contact detection, and mortar contact detection, wherein Gauss-point detection corresponds to a zero-order rank of contiguous contact elements at the splitting boundary, nodal-point detection corresponds to a first-order rank of contiguous contact elements at the splitting boundary, and mortar contact detection corresponds to a second-order rank of contiguous contact elements at the splitting boundary.

18. A non-transitory computer-readable medium including instructions therein that, when executed by a processor in a computer modeling system, cause the system to perform operations comprising:
  generating, in a first processor, a contact pair comprising a contact surface and a target surface, wherein the contact pair further comprises a plurality of contact elements of the contact surface and the target surface;

splitting the contact pair into contact sub-pairs along splitting boundaries;

augmenting each contact sub-pair with the contact elements of the contact surface and the target surface from adjacent contact sub-pairs at the splitting boundaries;

distributing the augmented contact sub-pairs to a plurality of parallel processors for finite element solutions of the contact sub-pairs;

receiving the finite element solutions of the contact sub-pairs from the plurality of parallel processors; and combining the finite element solutions of the contact sub-pairs into finite element solutions of the contact pair.

19. The computer-readable medium of claim 18, wherein the contact elements from adjacent contact sub-pairs comprise contiguous contact elements from the adjacent contact sub-pairs at the splitting boundaries, and wherein a rank-order of the contiguous contact elements corresponds to a method of contact detection.

20. The computer-readable medium of claim 19, wherein the method of contact detection comprises one of Gauss-point contact detection, nodal-point contact detection, and mortar contact detection, wherein Gauss-point detection corresponds to a zero-order rank of contiguous contact elements at the splitting boundaries, nodal-point detection corresponds to a first-order rank of contiguous contact elements at the splitting boundaries, and mortar contact detection corresponds to a second-order rank of contiguous contact elements at the splitting boundaries.

\* \* \* \* \*